United States Patent
Fukatani et al.

(10) Patent No.: US 7,651,640 B2
(45) Date of Patent: Jan. 26, 2010

(54) GALLIUM CONTAINING ZINC OXIDE

(75) Inventors: Juichi Fukatani, Koka (JP); Bungo Hatta, Koka (JP); Tetsuya Yamamoto, Kami-gun (JP)

(73) Assignees: Sekisui Chemical Co., Ltd., Osaka-shi (JP); Kochi University of Technology, Kami-Gun (JP)

(*) Notice: Subject to any disclaimer, the term of this patent is extended or adjusted under 35 U.S.C. 154(b) by 210 days.

(21) Appl. No.: 10/580,030

(22) PCT Filed: Feb. 23, 2006

(86) PCT No.: PCT/JP2006/303331

§ 371 (c)(1), (2), (4) Date: Aug. 31, 2007

(87) PCT Pub. No.: WO2006/090806

PCT Pub. Date: Aug. 31, 2006

(65) Prior Publication Data

US 2008/0315160 A1 Dec. 25, 2008

(30) Foreign Application Priority Data

Feb. 24, 2005 (JP) ............................... 2005-049453

(51) Int. Cl.
*H01B 1/08* (2006.01)

(52) U.S. Cl. ............................ 252/519.51; 250/515.1
(58) Field of Classification Search ............ 252/519.51; 250/515.1; 427/160
See application file for complete search history.

(56) References Cited

FOREIGN PATENT DOCUMENTS

| JP | 61-96609 | 5/1986 |
|---|---|---|
| JP | 62-154411 | 7/1987 |
| JP | HEI. 1-201021 | 8/1989 |
| JP | 2000-273617 | * 10/2000 |
| JP | 2001-329363 | 11/2001 |
| JP | 2004-292839 | 10/2004 |
| JP | 2006-117462 | 5/2006 |

OTHER PUBLICATIONS

Song et al "Electrical and optical properties of gallium-doped zinc oxide films ... ", Thin Solid Films, 411(2002) 82-86.*

* cited by examiner

*Primary Examiner*—Mark Kopec
(74) *Attorney, Agent, or Firm*—Connolly Bove Lodge & Hutz LLP

(57) ABSTRACT

A gallium containing zinc oxide with an improved heat ray shielding function while keeping high transparency to visible light rays is provided. A gallium containing zinc oxide, which has a heat ray shielding function, a gallium content in the range of 0.25 to 25 % by weight, and a carrier electron density $n_e$ of $2\times10^{20}/\text{cm}^3$ or higher.

19 Claims, 10 Drawing Sheets

GALLIUM CONTAINING ZINC OXIDE

TECHNICAL FIELD

The present invention relates to a gallium containing zinc oxide with an improved heat ray shielding function while keeping high transparency to visible light rays.

BACKGROUND ART

Conventionally, different kind metal-doped conductive metal oxides such as tin-doped indium oxide (ITO), antimony-doped tin oxide (ATO), and aluminum-doped zinc oxide (AZO) have been known as materials transparent of visible light rays and having high conductivity and they have been used as transparent conductive films and transparent electrodes of liquid crystal displays and solar cells. Further, glass on which these conductive metal oxides are deposited has been used as heat ray shielding glass for windows of buildings and windows of automobiles.

Among these heat ray shielding materials, in particular, tin-doped indium oxide (ITO) is excellent in the heat ray shielding function, however since indium reserve is slight and indium is a by-product of minerals of zinc and lead, exhaustion and steep rise in costs because of mass consumption for the transparent conductive films for liquid crystal displays in recent years have been serious concern.

As a heat ray shielding material in place of ITO having these resources problem, and the supply and the cost problem, heat ray shielding materials using zinc oxide whose raw materials exist in abundance and economical have been investigated. However, zinc oxide is inferior in the shielding property of light rays with wavelength near infrared (IR) region as compared with ITO.

As heat ray shielding materials of different metal-doped zinc oxide, aluminum containing zinc oxide thin films are disclosed in Patent Document No. 1 and No. 2. However, aluminum is easier to be reacted with oxygen than zinc, a component element of zinc oxide, and as a result, in a product such as a thin film, aluminum is locally precipitated in form of an oxide and causes a problem that the optical properties such as transmission and refractive index and electric properties such as conductivity are uneven. Further, aluminum element has another problem that aluminum is not easy to be added (doped) by film formation methods other than sputtering. Furthermore, it is also difficult to add aluminum to a concentration sufficient to exhibit the heat ray shielding function.

Patent Document No. 3 discloses zinc oxide thin films containing at least one kind of Group XIV elements.

In the sunrays, IR rays having wavelength of at shortest 780 nm longer than visible light rays have a small energy quantity, about 10%, as compared with ultraviolet (UV) rays, however IR rays have a significant thermal function and are released as heat energy to increase the temperature if once being absorbed in a substance and therefore they are generally called as heat ray.

Accordingly, for example, if it is made possible to shield IR rays having the significant thermal function among sunrays coming through an aperture part, the heat shielding property is heightened and the temperature increase in the inside can be suppressed. Particularly, the energy ratio of near IR rays with wavelength of 780 to 1500 nm in IR rays is high and the energy ratio of near IR rays with wavelength of 780 to 1000 nm is particularly high. As a matter of fact, with respect to a weighed coefficient for calculating the solar transmission Ts according to JIS R 3106, it is set higher. In other words, if the near IR rays with wavelength of 780 to 1000 nm are not effectively shielded, the solar transmission can not be lowered while the visible light transmission is kept high.

However, the zinc oxide thin films containing at least one kind of Group XIV elements disclosed in Patent Document No. 3 have high transmission, about 90% of light rays with wavelength of 750 nm and about 80% of light rays with wavelength of 1000 nm and thus are incapable of sufficiently suppressing the solar transmission while keeping the visible light transmission high.

Patent Document No. 1: Japanese Kokai Publication Sho-61-96609

Patent Document No. 2: Japanese Kokai Publication Hei-1-201021

Patent Document No. 3: Japanese Patent No. 1802011

DISCLOSURE OF THE INVENTION

Problems which the Invention is to Solve

In view of the above-mentioned state of the art, the present invention aims to provide a gallium containing zinc oxide with an improved heat ray shielding function while keeping high transparency to visible light rays.

Means for Solving the Object

The present invention provides a gallium containing zinc oxide, which has a heat ray shielding function, a gallium content of in the range of 0.25 to 25% by weight, and a carrier electron density $n_e$ of $2 \times 10^{20}/cm^3$ or higher.

Hereinafter, the present invention will be described in detail.

On the basis of results of intensive investigations, inventors of the present invention have found that a gallium containing zinc oxide obtained by adding a gallium in a specified content to zinc oxide and controlling the carrier electron density to be a prescribed value can lower the transmission of light with wavelength in the near IR region while keeping the visible light transmission high and the findings have led to completion of the present invention.

Herein, a gallium containing zinc oxide obtained by adding a gallium in a specified content to zinc oxide is disclosed in Japanese Patent No. 3453805, however the gallium containing zinc oxide in this patent is produced to improve the conductivity.

On the other hand, the gallium containing zinc oxide of the present invention is based on the finding that there are correlations of the heat ray shielding function with the carrier electron density and the carrier electrons mobility of the gallium containing zinc oxide.

Accordingly, a metal thin film having visible light transmission and solar transmission in properly controlled ranges can be produced.

Additionally, with respect to the gallium containing zinc oxide of the present invention, as described below, the oxygen flow amount is adjusted at the time of production, so that the oxygen deficient degree can be controlled and consequently, the carrier electron density and the carrier electron mobility can be changed and gallium containing zinc oxide having an excellent heat ray shielding function can be obtained without considerable change of the crystal structure.

For that, the gallium containing zinc oxide described in Japanese Patent No. 3453805 and the gallium containing zinc oxide of the present invention are totally different from each other.

The content of gallium in the gallium containing zinc oxide of the present invention is 0.25% by weight in the lower limit and 25% by weight in the upper limit for the entire gallium containing zinc oxide. If it is lower than 0.25% by weight, the transmission of light with wavelength in near IR region becomes high and the gallium containing zinc oxide does not have the heat ray shielding function and if it exceeds 25% by weight, gallium causes metal agglomeration or is converted into oxide to form precipitates and it results in significant dispersion of local brightness and heat ray shielding property in a plane and impossibility of attaining high heat ray shielding function. The content is preferably 1% by weight in the lower limit and 15% by weight in the upper limit, more preferably 1.5% by weight in the lower limit and 11% by weight in the upper limit, furthermore preferably 3% by weight in the lower limit and 6% by weight in the upper limit, even more preferably 4% by weight in the lower limit and 5.5% by weight in the upper limit, and mostly preferably 5% by weight in the upper limit.

The content of gallium in the gallium containing zinc oxide of the present invention can be calculated by XRF (X-Ray Fluorescence analysis)-FP (Fundamental Parameter) method beside the above-mentioned weight ratio and it is preferably $1\times10^{20}/cm^3$ in the lower limit and $80\times10^{20}/cm^3$ in the upper limit.

The carrier electron density $n_e$ of the gallium containing zinc oxide of the present invention is $2\times10^{20}/cm^3$ in the lower limit. The heat ray shielding function of the gallium containing zinc oxide of the present invention is attributed to the electron movement between gallium and zinc oxide and if the carrier electron density is lower than $2\times10^{20}/cm^3$, no sufficient heat ray shielding function can be obtained. The lower limit is preferably $7\times10^{20}/cm^3$ and more preferably $1\times10^{21}/cm^3$.

The carrier electron mobility $\mu$ of the gallium containing zinc oxide of the present invention is not particularly limited, however it is preferably 0.1 $cm^2/Vs$ in the lower limit and 40 $cm^2/Vs$ in the upper limit. If it is lower than 0.1 $cm^2/Vs$, owing to uneven precipitation of impurities in the zinc oxide crystal structure, plane distribution of gallium concentration becomes wide and the structure becomes unstable and if it exceeds 40 $cm^2/Vs$, the heat ray shielding function becomes insufficient. It is more preferably 1 $cm^2/Vs$ in the lower limit and 35 $cm^2/Vs$ in the upper limit, furthermore preferably 5 $cm^2/Vs$ in the lower limit and 32 $cm^2/Vs$ in the upper limit, and even more preferably 10 $cm^2/Vs$ in the lower limit and 30 $cm^2/Vs$ in the upper limit.

With respect to the gallium containing zinc oxide of the present invention, the above-mentioned carrier electron density and the carrier electron mobility can be obtained by measuring hole effect measurement by the method of L. J. van der Pauw and in the case of measurement for the gallium containing zinc oxide of the present invention in form of a thin film, they can be determined by at first measuring the film thickness by a contact method or the like and then carrying out the hole effect measurement by the method of L. J. van der Pauw.

With respect to the gallium containing zinc oxide of the present invention, it is preferable that the carrier electron density $n_e$ and the carrier electron mobility $\mu$ satisfy the following inequality: $0.2 \leq (n_e \times 10^{-20}/\mu)$ and the solar transmission Ts and the visible light transmission Tv satisfy the following inequality: $Tv/Ts \geq 1.0$. If the carrier electron density $n_e$ and the carrier electron mobility $\mu$ are controlled to satisfy the inequality: $0.2 \leq (n_e \times 10^{-20}/\mu)$, the solar transmission Ts and the visible light transmission Tv are controlled to satisfy the inequality: $Tv/Ts \geq 1.0$. From a viewpoint of practical application, it is preferably $0.2 \leq (n_e \times 10^{-20}/\mu) \leq 50$, more preferably $0.2 \leq (n_e \times 10^{-20}/\mu) \leq 20$, furthermore preferably $0.2 \leq (n_e \times 10^{-20}/\mu) \leq 10$, and even more preferably $0.2 \leq (n_e \times 10^{-20}/\mu) \leq 5$.

Generally, to improve the conductivity of zinc oxide, it is tried to obtain high conductivity by increasing the carrier electron density as well as the carrier electron mobility.

Accordingly, it is desired for conductive zinc oxide to have a high product of the carrier electron density and carrier electron mobility.

However, focusing on the heat ray shielding function, it has been found that as the carrier electron density is increased higher, the plasma frequency is shifted to the shorter wavelength side and thus the heat ray shielding function can be improved more. On the other hand, as the carrier electron mobility is lowered more, the absorption coefficient of IR rays is increased more and thus the heat ray shielding function can be improved more. That is, either the carrier electron density is increased or the carrier electron mobility is lowered, so that the heat ray shielding function so efficient as to satisfy $Tv/Ts \geq 1.0$ can be obtained.

Accordingly, it has been found that an extremely high heat ray shielding function can be accomplished by increasing the carrier electron density and lowering the carrier electron mobility.

Practically, with respect to the gallium containing zinc oxide of the present invention, the carrier electron density $n_e$ and the carrier electron mobility $\mu$ are preferable to satisfy the inequality: $\mu \leq 3.75\, n_e \times 10^{-20}$.

If $\mu \leq 3.75\, n_e \times 10^{-20}$ is satisfied, an extremely high heat ray shielding function can be accomplished.

The gallium containing zinc oxide of the present invention is preferable to further contain an element having a covalent bond radius different from that of zinc atom in the same content or lower than the content of the gallium.

Addition of the above-mentioned element having a covalent bond radius different from that of zinc atom causes strains in the shape of the gallium containing zinc oxide crystal and as a result, the carrier electrons mobility can be decreased to a preferable range and addition of element having a covalent bond radius different from that of zinc atom in the same content or lower than the content of the gallium provides a further improved heat ray shielding function to the gallium containing zinc oxide of the present invention without interfering the above-mentioned properties of gallium.

The above-mentioned element having a covalent bond radius different from that of zinc atom is not particularly limited and elements having a tetra-coordination ion radius in the range of 0.4 to 0.95 nm except gallium are preferable.

If the ion radius is smaller than 0.4 nm, the effect of causing the stains in the crystal is too slight to obtain the heat ray shielding function in some cases and if it exceeds 0.95 nm, the crystal is too much strained the stability of the crystal and the reproducibility in production become scant owing to excess strains of the crystal. Practically, indium, silicon, thallium, tin, lead, cadmium, cobalt, iron, molybdenum, manganese and the like can be exemplified.

Herein, the ion radius in this description is based on the document: Acta Crystallogr., A 32, 751 (1976) proposed by Shannon.

In this connection, in the case of a cation, the numerical value obtained by adding 0.14 to the ion radius according to the definition by Shannon is defined as the commonly employed ion radium (there are descriptions in e.g. Introduction to Solid Chemistry written by L. SMART, E. MOORE (Kagaku-Dojin Publishing Company, INC.), Inorganic Chemistry, second edition written by Gary L Misees slek, Dodald A Tarr (PHIPE PRENTICE HALL Inc.).

Accordingly, the ion radius in the present invention is defined as the numerical value obtained by adding 0.14 to the ion radius according to the definition by Shannon.

The above-mentioned element having a covalent bond radius different from that of zinc atom is particularly preferable to be an element of Group XIII elements or Group XIV elements except gallium. Practical examples of the element is indium and thallium of the Group XIII elements and tin and lead of Group XIV elements.

Also, the above-mentioned element having a covalent bond radius different from that of zinc atom is preferably fluorine element or chlorine element besides the above-mentioned exemplified elements.

Addition of the above-mentioned fluorine element or chlorine element provides a high heat ray shielding function to the gallium containing zinc oxide of the present invention.

Regarding the obtained gallium containing zinc oxide, the heat ray shielding function may be improved by increasing the quantity of the oxygen deficiency by further heating in the reducing gas atmosphere.

However, if the quantity of the oxygen deficiency is increased to an excess extent, the moisture resistance is deteriorated, physical property alteration with the lapse of time become too significant or local luster is caused and crystal structure of zinc oxide cannot be maintained because of zinc precipitation and therefore, addition has to be carried out carefully.

Since the gallium containing zinc oxide of the present invention has a high solar transmission and the heat ray shielding function, it can be used as vehicular window glass by being formed in a thin film.

A production method of gallium containing zinc oxide and a gallium containing zinc oxide thin film of the present invention is preferably an ion plating method using an ion plating apparatus as described below.

The present invention also includes the gallium containing zinc oxide thin film produced from the gallium containing zinc oxide of the present invention.

The gallium containing zinc oxide thin film of the present invention is produced of the gallium containing zinc oxide of the present invention and has a film thickness of 5 μm or thinner, the solar transmission Ts and the visible light transmission Tv satisfying $Ts \leq 1.4 Tv-39$.

If the above-mentioned correlation is not satisfied, that is $Ts > 1.4 Tv-39$, it results in the following consequence: even if the heat ray shielding function is sufficient, in the case the thin film is used for window glass for vehicles, proper visible light transmission can obtained but the heat ray shielding function cannot sufficiently be exhibited to a required extent.

Also, if the film thickness is in the range of 30 to 350 nm, $Ts \leq 1.4 Tv-44$ is preferable and $Ts \leq 1.4 Tv-54$ is more preferable. If the film thickness is in the range of 350 to 5000 nm, $Ts \leq 1.4 Tv-54$ is preferable and $Ts \leq 1.4 Tv-63$ is more preferable.

The film thickness of the gallium containing zinc oxide thin film of the present invention is preferably in the range of 350 to 5000 nm, more preferably in the range of 100 to 5000 nm, furthermore preferably in the range of 200 to 2000 nm, and even more preferably in the range of 400 to 2000 nm, however since the gallium containing zinc oxide thin film of the present invention can sufficiently exhibit the heat ray shielding function even if being thin, the thickness may be 30 to 350 nm, 100 to 300 nm, 150 to 300 nm, 100 to 200 nm, 200 to 300 nm or the like.

The gallium containing zinc oxide thin film of the present invention is preferable to have a film thickness of 5000 nm or thinner, and the visible light transmission Tv of 70% or higher and/or the transmission of 70% or higher for light rays with wavelength of 500 nm.

If the film thickness exceeds 5000 nm, in the case the gallium containing zinc oxide thin film of the present invention is used for window glass for vehicles, a desirable visible light transmission for the window glass for vehicles cannot be obtained and therefore good visibility cannot be obtained in some cases.

The Tv is more preferably 75% or higher and/or the transmission for light rays with wavelength of 500 nm is more preferably 75% or higher, and the Tv is furthermore preferably 80% or higher and/or the transmission for light rays with wavelength of 500 nm is furthermore preferably 80% or higher.

The gallium containing zinc oxide thin film of the present invention is preferable to have the transmission of 88% or lower for light rays with wavelength of 750 nm. If the transmission for light rays with wavelength of 750 nm exceeds 88%, the sufficient heat ray shielding function cannot be obtained in some cases.

The transmission for light rays with wavelength of 750 nm is more preferably 75% or lower, furthermore preferably 65% or lower, and even more preferably 55% or lower.

The gallium containing zinc oxide thin film of the present invention is preferable to have the transmission of 80% or lower for light rays with wavelength of 1000 nm. If the transmission for light rays with wavelength of 1000 nm exceeds 80%, the sufficient heat ray shielding function cannot be obtained in some cases.

The transmission for light rays with wavelength of 1000 nm is more preferably 60% or lower, furthermore preferably 50% or lower, and even more preferably 40% or lower.

The gallium containing zinc oxide thin film of the present invention is preferable to have the transmission of 65% or lower for light rays with wavelength of 1200 nm. If the transmission for light rays with wavelength of 1200 nm exceeds 65%, the sufficient heat ray shielding function cannot be obtained in some cases.

The transmission for light rays with wavelength of 1200 nm is more preferably 35% or lower, furthermore preferably 25% or lower, and even more preferably 15% or lower.

The gallium containing zinc oxide thin film of the present invention is preferable to have the transmission of 40% or lower for light rays with wavelength of 1500 nm. The light rays with wavelength of around 1500 nm included in the sunrays are highly effective to give scorching stimulation to the skin. If the transmission for light rays with the wavelength is suppressed, the stimulation to the skin by the heat beam can be moderated. Accordingly, if the transmission for light rays with wavelength of 1500 nm is 40% or lower, the stimulation by the heat ray can sufficiently be lessened.

The transmission for light rays with wavelength of 1500 nm is more preferably 15% or lower, furthermore preferably 10% or lower, and even more preferably 5% or lower.

The present invention also include a gallium containing zinc oxide thin film which satisfies $Y \geq 0.4 X+1.06$ in the case the film thickness is 400 nm or thicker and $Y \geq 0.2 X+0.98$ in the case the film thickness is 300 nm or thinner, in the case X is the value of (carrier electron density $\times 10^{-20}$/carrier electron mobility) and Y is the value of Tv/Ts.

That the thin film satisfies $Y \geq 0.4 X+1.06$ in the case the film thickness is 400 nm or thicker means if the carrier electron density is heightened and the carrier electron mobility is lowered, it is made possible to obtain a gallium containing zinc oxide thin film with an extremely high heat ray shielding function giving a high visible light transmission Tv while keeping a high solar transmission Ts.

On the other hand, that the thin film satisfies Y≧0.2 X+0.98 in the case the film thickness is 300 nm or thinner means if the carrier electron density is heightened and the carrier electron mobility is lowered, it is made possible to obtain a gallium containing zinc oxide thin film with a very high heat ray shielding function giving a high visible light transmission Tv while keeping a high solar transmission Ts.

Further, it is made clear that the gallium containing zinc oxide satisfying Y≧0.4 X+1.06, which means the extremely high heat ray shielding function can be attained in the case the film thickness is 400 nm or thicker, can be produced stably. Accordingly, if the film thickness is 400 nm or thicker, the extremely high heat ray shielding function can be obtained.

The production method of the above-mentioned gallium containing zinc oxide thin film is preferably an ion plating method using an ion plating apparatus (hereinafter, also referred to as reactive plasma deposition apparatus) by RPD (Reactive Plasma Deposition) method.

FIG. 1 is a schematic drawing of one embodiment of the reactive plasma deposition apparatus.

The RPD method is a method for forming a film of the respective particles of zinc oxide to the substrate 1 put on the opposite to the hearth 2 by setting zinc oxide containing a dopant (gallium) as a film formation material in a hearth 2 as an electrode part installed in a film formation chamber, heating the substrate 1 to about 200° C., keeping the temperature for a while, radiating plasma using argon or the like to the zinc oxide from a plasma beam generator 3 for heating the zinc oxide, evenly evaporating the surface of the zinc oxide as a target.

According to the method, the thin film composition of the film formed on the substrate can be kept even from an initial period of the thin film formation to the final period of the thin film formation without alteration of the composition in the film during the film formation to give a thin film with a uniform composition. Unlike a magnetron sputtering method, the substrate temperature is scarcely increased during the film formation, so that an extremely even thin film can be obtained if a sputtering raw material with high purity is used.

In a production method of a gallium containing zinc oxide thin film by conventional ion plating method, it is common to enclose a large quantity of oxygen gas through a ventilation hole 4 for assisting oxidation during the film formation and evacuate the gas through an evacuation hole 5.

However, to produce the gallium containing zinc oxide thin film of the present invention, it is found that oxygen flow amount is rather lowered so as to draw a higher heat ray shielding function. Further, surprisingly, it is found that particularly in the case the gallium content is in the range of 0.25 to 5.5% by weight, it is no at all need to introduce oxygen gas.

Practically, in the case, for example, a plasma plating system by the RPD method manufactured by Sumitomo Heavy Industries, Ltd., the oxygen flow amount is adjusted by changing the pressure of a partial pressure pump to lower the oxygen flow amount 13 sccm or lower, and the carrier electron density and the carrier electron mobility can thus be kept in the above-mentioned ranges.

However, if the gallium content exceeds 5.5% by weight, it is preferable to assist oxidation by oxygen gas. Without oxygen gas, the film quality cannot be stabilized and it sometimes becomes difficult to obtain a desired gallium containing zinc oxide thin film. That is, it sometimes becomes difficult to obtain an even gallium containing zinc oxide thin film at a high reproducibility.

The present invention also include a gallium containing zinc oxide thin film which is produced under a condition of a gallium content of in the range of 0.25 to 5.5% by weight and oxygen flow amount in the range of 0 to 10 sccm, the solar transmission Ts and the visible light transmission Tv satisfying Ts≦1.4 Tv−39.

And the present invention also include a gallium containing zinc oxide thin film which is produced under a condition of a gallium content of in the range of 5.5 to 25% by weight and oxygen flow amount exceeding 0 sccm and not higher than 13 sccm, the solar transmission Ts and the visible light transmission Tv satisfying Ts≦1.4 Tv−39.

An even gallium containing zinc oxide thin film can be obtained at a high reproducibility and an excellent heat ray shielding function can be obtained by satisfying the above-mentioned relation.

FIG. 2 shows the correlation of the visible light transmission Tv and the solar transmission Ts of gallium containing zinc oxide thin films of the present invention having a film thickness of in the range of 100 to 300 nm and aluminum containing zinc oxide thin films with a film thickness of in the range of 100 to 300 nm described in Japanese Kokai Publication Hei-1-201021.

In the case of approximately same film thickness, the gallium containing zinc oxide thin films of the present invention are found having sufficient transparency to use them for glass for vehicles although decreased in the visible light transmission as compared with the conventional aluminum containing zinc oxide thin films, and the gallium containing zinc oxide thin films also are found having a remarkably improved heat ray shielding function as compared with the conventional aluminum containing zinc oxide thin films.

FIG. 3 shows the correlation of the visible light transmission Tv and the solar transmission Ts of gallium containing zinc oxide thin films of the present invention having a film thickness in the range of 527 to 705 nm, an aluminum containing zinc oxide thin films with a film thickness of 577.2 nm described in Japanese Kokai Publication Hei-1-201021, and an aluminum containing zinc oxide thin films with a film thickness of 2000 nm described in Japanese Kokai Publication Hei-6-293956.

Similarly to FIG. 2, in the case of approximately same film thickness, the gallium containing zinc oxide thin films of the present invention are found having sufficient transparency to use them for glass for vehicles although decreased in the visible light transmission as compared with the conventional aluminum containing zinc oxide thin film described in Japanese Kokai Publication Hei-1-201021.

Also, since the visible light transmission Tv and the solar transmission Ts of the gallium containing zinc oxide thin films of the present invention having a film thickness in the range of 527 to 705 nm and approximately same as those of the conventional aluminum containing zinc oxide thin films with a film thickness of 2000 nm, the gallium containing zinc oxide thin films of the present invention are found having a sufficient heat ray shielding function with no need to have a film thickness so thick as that of the conventional aluminum containing zinc oxide thin film.

Effect of the Invention

The present invention can provide a gallium containing zinc oxide with an improved heat ray shielding function while keeping high transparency to visible light rays.

BEST MODE FOR CARRYING OUT THE INVENTION

Hereinafter, the present invention will be described in details with reference to examples, however the present invention is not limited to these examples.

In an ion plating apparatus by a RPD method employed in the following experiments, argon was used for plasma gas as the operation transmission other than oxygen partial pressure and while the argon flow amount was kept constant at 30 sccm, the oxygen flow amount was changed to change the oxygen partial pressure. The plasma radiation current was kept at 100 A. The film thickness of zinc oxide films was adjusted to be in the range of 100 nm to 3000 nm (measured by a Surface Profiler). Glass substrates (NA 35, alkali-free glass, TFT-grade one side-polished product, manufactured by NH Techno glass Co., Ltd., 120 mm×120 mm×0.7 mm) were used as the materials to be coated with the zinc oxide films. Washing of the glass substrates was carried out as follows: 1: rubbing with a detergent, 2: washing for 10 minutes with flowing water, 3: ultrasonic washing for 5 minutes with pure water (repeated twice), 4: ultrasonic washing for 5 minutes with isopropyl alcohol, and 5: blowing with nitrogen gas in this order. The temperature of the glass substrates was adjusted to be at 200° C. The oxygen gas for assisting oxidation during the film formation was changed between 0 sccm and 20 sccm.

EXPERIMENT EXAMPLES 1 TO 10 AND EXPERIMENT EXAMPLES 13 TO 19

Gallium containing zinc oxide thin films with compositions shown in Table 1 were produced by using the ion plating apparatus shown in FIG. 1. The film thicknesses were as shown in Table 1.

EXPERIMENT EXAMPLES 11 AND 12 AND EXPERIMENT EXAMPLES 20 TO 21

Gallium containing zinc oxide thin films with compositions shown in Table 1 which further contained dopants with the compositions shown in Table 1 were produced by using the ion plating apparatus shown in FIG. 1. The film thicknesses were as shown in Table 1.

<Evaluation>

The gallium containing zinc oxide thin films obtained in Experiment examples 1 to 21 were subjected to the following evaluations. The results are shown in Table 1.

(1) Measurement of Gallium Content (Gallium Content in Raw Materials and Films)

In addition to the contents (% by weight) of gallium in zinc oxide raw materials, the contents of gallium in the formed gallium containing zinc oxide thin films were measured by XRF (X-ray Fluorescence analysis)-FP (Fundamental Parameter) method. The measurement was carried out using the following apparatus under the following conditions.

PW2400 manufactured by Spectris Co., Ltd.

Sample diameter: 10 mmφ

FP processing soft: FP-MULTI (2) Measurement of Carrier Electron Density and Carrier Electron Mobility The carrier electron density and the carrier electron mobility were measured by hole effect measurement. The measurement was carried out using the following apparatus under the following conditions.

HL 5570PC, manufactured by ACCENT OPTICAL TECHNOLOGIES Co., Ltd.

Sample size: 10 mm square (3) Measurement of Transmission

Using a spectrophotometer (U-4000, manufactured by Hitachi Ltd.), the transmission at 500 nm, 750 nm, 1000 nm, 1200 nm, and 1500 nm in the near IR region was measured. Also, the transmission for light rays with wavelength of in the range of 300 to 2100 nm was measured according to JIS R 3106 and from these measurement results, the visible light transmission Tv and the solar transmission Ts were calculated.

TABLE 1

|  | gallium content in raw material (wt. %) | gallium content by XRF-FP ($10^{20}/cm^3$) | content of simultaneously added dopant by XRF-FP ($10^{20}/cm^3$), element shown in parenthesis | film thickness (nm) | oxygen flow amount (sccm) | carrier electron density $n_e$ ($10^{20}/cm^3$) | carrier electron mobility μ ($cm^2/Vs$) | $n_e \times 10^{-20}/$ μ |
|---|---|---|---|---|---|---|---|---|
| Experiment example 1 | 3 | 9 | 0 | 200 | 5 | 7.7 | 27 | 0.29 |
| Experiment example 2 | 3 | 9.3 | 0 | 200 | 5 | 8.8 | 24.5 | 0.36 |
| Experiment example 3 | 3 | 9.4 | 0 | 500 | 5 | 9.1 | 17 | 0.54 |
| Experiment example 4 | 4 | 12 | 0 | 500 | 5 | 11.8 | 21 | 0.56 |
| Experiment example 5 | 5 | 15 | 0 | 500 | 5 | 13 | 20 | 0.65 |
| Experiment example 6 | 7 | 21.5 | 0 | 200 | 10 | 20.6 | 6 | 3.43 |

TABLE 1-continued

|  |  |  |  |  |  |  |  |  |
|---|---|---|---|---|---|---|---|---|
| Experiment example 7 | 7 | 20.5 | 0 | 200 | 10 | 19 | 9.2 | 2.07 |
| Experiment example 8 | 10 | 30.5 | 0 | 200 | 10 | 27.2 | 1.9 | 14.32 |
| Experiment example 9 | 10 | 30 | 0 | 200 | 10 | 26.5 | 2.6 | 10.19 |
| Experiment example 10 | 20 | 32 | 0 | 200 | 10 | 27.1 | 2.1 | 12.90 |
| Experiment example 11 | 10 | 29 | 9 (Si) | 200 | 10 | 25.5 | 1 | 25.50 |
| Experiment example 12 | 10 | 28.5 | 9.5 (Si) | 200 | 10 | 25.8 | 0.9 | 28.67 |
| Experiment example 13 | 5 | 15 | 0 | 2000 | 5 | 13 | 12 | 1.08 |
| Experiment example 14 | 5 | 15 | 0 | 3000 | 5 | 12.5 | 10 | 1.25 |
| Experiment example 15 | 5 | 15 | 0 | 400 | 5 | 13 | 20.5 | 0.63 |
| Experiment example 16 | 5 | 15 | 0 | 600 | 5 | 13 | 21.5 | 0.60 |
| Experiment example 17 | 10 | 30 | 0 | 1000 | 10 | 20.5 | 9.1 | 2.25 |
| Experiment example 18 | 10 | 30.5 | 0 | 1500 | 10 | 15.5 | 12 | 1.29 |
| Experiment example 19 | 10 | 30 | 0 | 2000 | 10 | 20.5 | 4.6 | 4.46 |
| Experiment example 20 | 10 | 29 | 9 (In) | 200 | 10 | 22.5 | 0.5 | 45.00 |
| Experiment example 21 | 10 | 28.5 | 9.5 (Al) | 200 | 10 | 26.5 | 0.7 | 37.86 |

|  | transmission (500 nm) | transmission (750 nm) | transmission (1000 nm) | transmission (1200 nm) | transmission (1500 nm) | visible light transmission Tv (%) | solar transmission Ts (%) | Tv/Ts |
|---|---|---|---|---|---|---|---|---|
| Experiment example 1 | 96 | 94 | 90 | 80 | 50 | 96 | 80 | 1.20 |
| Experiment example 2 | 96 | 94 | 90 | 65 | 39.5 | 96 | 80 | 1.20 |
| Experiment example 3 | 84.6 | 81.2 | 57.9 | 27.3 | 3 | 84.5 | 62.6 | 1.35 |
| Experiment example 4 | 83.1 | 80.4 | 43 | 12.5 | 0.8 | 83.6 | 58.7 | 1.42 |
| Experiment example 5 | 82.9 | 80.4 | 39.6 | 21 | 0.8 | 83.1 | 57.8 | 1.44 |
| Experiment example 6 | 83 | 80 | 65 | 22 | 9 | 78 | 51 | 1.53 |
| Experiment example 7 | 90 | 87 | 73 | 25 | 10 | 85 | 64 | 1.33 |
| Experiment example 8 | 82 | 79 | 64 | 15 | 3 | 77 | 47 | 1.64 |
| Experiment example 9 | 85 | 82 | 66 | 18 | 4 | 80 | 51 | 1.57 |
| Experiment example 10 | 83 | 80 | 59 | 8 | 3.5 | 78 | 49 | 1.59 |
| Experiment example 11 | 80 | 77 | 62 | 6 | 2.5 | 75 | 43 | 1.74 |
| Experiment example 12 | 78 | 75 | 61.3 | 5.7 | 2.2 | 73 | 40 | 1.83 |
| Experiment example 13 | 82 | 78 | 60 | 34.5 | 9.5 | 83.3 | 61.9 | 1.35 |
| Experiment example 14 | 78 | 65 | 50 | 20 | 8.5 | 78.5 | 55.6 | 1.41 |
| Experiment example 15 | 83.3 | 81.2 | 52.4 | 10.5 | 2 | 83.6 | 61 | 1.37 |
| Experiment example 16 | 82.3 | 78 | 31.5 | 6.5 | 0.3 | 82.8 | 55.5 | 1.49 |
| Experiment example 17 | 78.5 | 65 | 50.5 | 20 | 9 | 78.3 | 56.2 | 1.39 |
| Experiment example 18 | 76 | 60 | 46 | 17 | 7 | 76 | 53 | 1.43 |
| Experiment example 19 | 77.7 | 56.6 | 20.5 | 9.8 | 5.6 | 77.8 | 45.8 | 1.70 |
| Experiment example 20 | 80 | 77 | 62 | 6 | 2.5 | 75 | 43 | 1.74 |
| Experiment example 21 | 78 | 75 | 61.3 | 5.7 | 2.2 | 73 | 40 | 1.83 |

EXPERIMENT EXAMPLES 22 TO 116

Gallium containing zinc oxide thin films with compositions shown in Tables 2 to 6 were produced by using the ion plating apparatus shown in FIG. 1. The film thicknesses were as shown in Tables 2 to 6.

<Evaluation>

The gallium containing zinc oxide thin films obtained in Experiment examples 22 to 116 were subjected to the following evaluations. The results are shown in Tables 2 to 6 and FIGS. 4 to 10.

(1) Measurement of Gallium Content (Gallium Content in Raw Materials and Films)

In addition to the contents (% by weight) of gallium in zinc oxide raw materials, the contents of gallium in the formed gallium containing zinc oxide thin films were measured by XRF (X-ray Fluorescence analysis)-FP (Fundamental Parameter) method. The measurement was carried out using the following apparatus under the following conditions.

PW2400 manufactured by Spectris Co., Ltd.
Sample diameter: 10 mmφ
FP processing soft: FP-MULTI (2) Measurement of Carrier Electron Density and Carrier Electron Mobility The carrier electron density and the carrier electron mobility were measured by hole effect measurement. The measurement was carried out using the following apparatus under the following conditions.

HL 5570PC, manufactured by ACCENT OPTICAL TECHNOLOGIES Co., Ltd.
Sample size: 10 mm square (3) Measurement of Transmission 1

Using a spectrophotometer (U-4000, manufactured by Hitachi Ltd.), the transmission at 500 nm, 750 nm, 1000 nm, 1200 nm, and 1500 nm in the near IR region was measured. Also, the transmission for light rays with wavelength of in the range of 300 to 2100 nm was measured according to JIS R 3106 and from these measurement results, the visible light transmission Tv and the solar transmission Ts were calculated. Further, among the thin films of Experiment examples 22 to 111, those having the carrier electron density of $1 \times 10^{21}$/cm$^3$ or higher were marked with ○; those having the carrier electron density of $7 \times 10^{20}$/cm$^3$ or higher and lower than $1 \times 10^{21}$/cm$^3$ were marked with ■; those having the carrier electron density of $2 \times 10^{20}$/cm$^3$ or higher and lower than $7 \times 10^{20}$/cm$^3$ were marked with Δ; and those having the carrier electron density of lower than $2 \times 10^{20}$/cm$^3$ were marked with x and the correlation of the visible light transmission Tv and the solar transmission Ts is shown in FIG. 4 and also the correlation of the oxygen flow amount and the carrier electron density is shown in FIG. 5.

Also, the correlation of the visible light transmission Tv and the solar transmission Ts of those having the gallium content in the range of 3 to 11% by weight and the oxygen flow amount in the range of 0 to 10 sccm among the gallium containing zinc oxide thin films of Experiment examples 22 to 111 is shown in FIG. 6 and the correlation of the carrier electron density $n_e$ and the carrier mobility μ is shown in FIG. 7.

Further, the relation of (carrier electron density$\times 10^{-20}$/carrier electron mobility) with Tv/Ts for the gallium containing zinc oxide thin films of Experiment examples 1 to 116 is shown in FIG. 8.

(4) Measurement of Transmission 2

With respect to the gallium containing zinc oxide thin films of Experiment examples 22 to 111, the transmission for the light rays with wavelength of in the range of 300 to 2500 nm was measured by a spectrophotometer (U-4000, manufactured by Hitachi Ltd.). FIG. 9 shows the correlation of the wavelength and transmission of those obtained under condition of oxygen flow amount of 5 sccm among the thin films and FIG. 10 shows the correlation of those obtained under condition of oxygen flow amount of 10 sccm.

TABLE 2

| | gallium content in raw material (wt. %) | film thickness (nm) | oxygen flow amount (sccm) | carrier electron density $n_e$ ($10^{20}$/cm$^3$) | carrier electron mobility μ (cm$^2$/Vs) | $n_e \times 10^{-20}$/μ | solar transmission Ts (%) | visible light transmission Tv (%) |
|---|---|---|---|---|---|---|---|---|
| Experiment example 22 | 1 | 120 | 0 | 4.933 | 20.7 | 0.24 | 79.5 | 81.5 |
| Experiment example 23 | 1 | 129 | 2.5 | 5.266 | 22.2 | 0.24 | 81.7 | 85.9 |
| Experiment example 24 | 1 | 140 | 5 | 5.033 | 24.8 | 0.20 | 81.8 | 87.4 |
| Experiment example 25 | 1 | 179 | 7.5 | 3.969 | 28.3 | 0.14 | 82.5 | 87.1 |
| Experiment example 26 | 1 | 296 | 10 | 3.174 | 33.4 | 0.10 | 83.2 | 80.7 |
| Experiment example 27 | 1 | 199 | 12.5 | 3.133 | 36.4 | 0.09 | 84.0 | 83.2 |
| Experiment example 28 | 1 | 213 | 15 | 2.602 | 35.2 | 0.07 | 84.6 | 81.5 |
| Experiment example 29 | 1 | 219 | 17.5 | 1.755 | 24.1 | 0.07 | 84.8 | 80.4 |
| Experiment example 30 | 1 | 233 | 20 | 1.246 | 14.7 | 0.08 | 84.5 | 81.4 |
| Experiment example 31 | 2 | 149 | 0 | 8.456 | 21.7 | 0.39 | 77.5 | 86.0 |
| Experiment example 32 | 2 | 148 | 2.5 | 8.202 | 23.1 | 0.36 | 78.8 | 86.6 |
| Experiment example 33 | 2 | 212 | 5 | 7.163 | 28.6 | 0.25 | 77.8 | 83.9 |

TABLE 2-continued

| | | | | | | | | |
|---|---|---|---|---|---|---|---|---|
| Experiment example 34 | 2 | 204 | 7.5 | 7.641 | 30.0 | 0.25 | 78.3 | 82.4 |
| Experiment example 35 | 2 | 236 | 10 | 6.446 | 32.5 | 0.20 | 79.0 | 82.0 |
| Experiment example 36 | 2 | 251 | 12.5 | 5.511 | 33.2 | 0.17 | 79.9 | 82.7 |
| Experiment example 37 | 2 | 256 | 15 | 4.794 | 31.7 | 0.15 | 80.6 | 83.5 |
| Experiment example 38 | 2 | 283 | 17.5 | 3.236 | 26.0 | 0.12 | 81.6 | 83.2 |
| Experiment example 39 | 2 | 263 | 20 | 2.218 | 20.1 | 0.11 | 83.8 | 84.8 |

| | Tv/Ts | 1.4Tv-54 | 1.4Tv-44 | transmission (500 nm) | transmission (750 nm) | transmission (1000 nm) | transmission (1200 nm) | transmission (1500 nm) |
|---|---|---|---|---|---|---|---|---|
| Experiment example 22 | 1.03 | 60.1 | 70.1 | 82.8 | 81.0 | 84.2 | 81.7 | 70.6 |
| Experiment example 23 | 1.05 | 66.3 | 76.3 | 87.4 | 83.8 | 85.8 | 81.9 | 69.1 |
| Experiment example 24 | 1.07 | 68.4 | 78.4 | 86.8 | 84.2 | 85.5 | 82.9 | 70.7 |
| Experiment example 25 | 1.06 | 67.9 | 77.9 | 81.9 | 87.0 | 85.6 | 84.0 | 73.7 |
| Experiment example 26 | 0.97 | 59.0 | 69.0 | 76.3 | 90.6 | 86.1 | 85.3 | 79.6 |
| Experiment example 27 | 0.99 | 62.5 | 72.5 | 77.5 | 90.2 | 86.4 | 86.2 | 80.6 |
| Experiment example 28 | 0.96 | 60.1 | 70.1 | 77.9 | 91.7 | 87.4 | 86.7 | 82.7 |
| Experiment example 29 | 0.95 | 58.6 | 68.6 | 80.8 | 92.0 | 88.3 | 86.5 | 84.5 |
| Experiment example 30 | 0.96 | 60.0 | 70.0 | 86.7 | 90.0 | 89.4 | 86.1 | 84.9 |
| Experiment example 31 | 1.11 | 66.4 | 76.4 | 85.1 | 84.8 | 81.3 | 68.5 | 52.7 |
| Experiment example 32 | 1.10 | 67.2 | 77.2 | 87.1 | 85.4 | 82.5 | 70.2 | 55.3 |
| Experiment example 33 | 1.08 | 63.5 | 73.5 | 79.0 | 88.1 | 83.0 | 69.8 | 47.6 |
| Experiment example 34 | 1.05 | 61.4 | 71.4 | 79.6 | 88.9 | 83.9 | 72.2 | 47.7 |
| Experiment example 35 | 1.04 | 60.8 | 70.8 | 82.7 | 89.1 | 84.8 | 75.6 | 51.1 |
| Experiment example 36 | 1.04 | 61.8 | 71.8 | 86.6 | 88.5 | 85.7 | 79.4 | 57.7 |
| Experiment example 37 | 1.04 | 62.9 | 72.9 | 88.7 | 88.4 | 86.7 | 81.4 | 61.6 |
| Experiment example 38 | 1.02 | 62.5 | 72.5 | 88.8 | 87.8 | 87.8 | 84.2 | 70.3 |
| Experiment example 39 | 1.01 | 64.7 | 74.7 | 90.8 | 88.2 | 89.7 | 86.6 | 79.8 |

TABLE 3

| | gallium content in raw material (wt. %) | film thickness (nm) | oxygen flow amount (sccm) | carrier electron density $n_e$ ($10^{20}$/cm$^3$) | carrier electron mobility μ (cm$^2$/Vs) | $n_e \times 10^{-20}$/μ | solar transmission Ts (%) | visible light transmission Tv (%) |
|---|---|---|---|---|---|---|---|---|
| Experiment example 40 | 3 | 193 | 0 | 10.48 | 24.2 | 0.43 | 73.8 | 85.9 |
| Experiment example 41 | 3 | 199 | 2.5 | 10.46 | 25.3 | 0.41 | 74.1 | 85.4 |
| Experiment example 42 | 3 | 206 | 5 | 10.02 | 25.9 | 0.39 | 74.1 | 84.5 |
| Experiment example 43 | 3 | 225 | 7.5 | 9.344 | 27.9 | 0.33 | 74.4 | 83.0 |
| Experiment example 44 | 3 | 240 | 10 | 8.343 | 29.9 | 0.28 | 75.1 | 82.7 |
| Experiment example 45 | 3 | 248 | 12.5 | 6.85 | 29.2 | 0.23 | 76.6 | 83.4 |
| Experiment example 46 | 3 | 263 | 15 | 5.365 | 28.5 | 0.19 | 78.5 | 83.5 |

TABLE 3-continued

| | | | | | | | | |
|---|---|---|---|---|---|---|---|---|
| Experiment example 47 | 3 | 255 | 17.5 | 4.060 | 26.7 | 0.15 | 81.2 | 84.3 |
| Experiment example 48 | 3 | 270 | 20 | 2.120 | 23.5 | 0.09 | 83.3 | 84.8 |
| Experiment example 49 | 4 | 178 | 0 | 11.84 | 22.7 | 0.52 | 73.9 | 87.6 |
| Experiment example 50 | 4 | 179 | 2.5 | 11.71 | 23.9 | 0.49 | 73.7 | 87.1 |
| Experiment example 51 | 4 | 216 | 5 | 10.26 | 25.0 | 0.41 | 73.5 | 85.7 |
| Experiment example 52 | 4 | 233 | 7.5 | 9.714 | 26.5 | 0.37 | 73.2 | 84.2 |
| Experiment example 53 | 4 | 236 | 10 | 9.691 | 28.4 | 0.34 | 74.0 | 83.6 |
| Experiment example 54 | 4 | 244 | 12.5 | 7.580 | 29.2 | 0.26 | 75.9 | 83.0 |
| Experiment example 55 | 4 | 273 | 15 | 5.829 | 31.2 | 0.19 | 77.7 | 85.1 |
| Experiment example 56 | 4 | 274 | 17.5 | 3.430 | 28.3 | 0.12 | 81.6 | 84.6 |
| Experiment example 57 | 4 | 278 | 20 | 2.851 | 27.0 | 0.11 | 82.7 | 85.1 |

| | Tv/Ts | 1.4Tv-54 | 1.4Tv-44 | transmission (500 nm) | transmission (750 nm) | transmission (1000 nm) | transmission (1200 nm) | transmission (1500 nm) |
|---|---|---|---|---|---|---|---|---|
| Experiment example 40 | 1.16 | 66.3 | 76.3 | 81.9 | 86.6 | 75.2 | 55.0 | 32.3 |
| Experiment example 41 | 1.15 | 65.6 | 75.6 | 81.1 | 86.9 | 76.0 | 55.6 | 32.7 |
| Experiment example 42 | 1.14 | 64.3 | 74.3 | 80.1 | 87.0 | 76.8 | 56.6 | 32.8 |
| Experiment example 43 | 1.12 | 62.2 | 72.2 | 80.5 | 87.4 | 78.3 | 58.2 | 31.6 |
| Experiment example 44 | 1.10 | 61.8 | 71.8 | 84.0 | 87.3 | 79.9 | 62.5 | 33.5 |
| Experiment example 45 | 1.09 | 62.8 | 72.8 | 87.5 | 87.1 | 82.1 | 70.0 | 40.5 |
| Experiment example 46 | 1.06 | 62.9 | 72.9 | 88.0 | 88.0 | 84.8 | 75.9 | 48.7 |
| Experiment example 47 | 1.04 | 64.0 | 74.0 | 89.8 | 87.6 | 87.6 | 83.6 | 67.2 |
| Experiment example 48 | 1.02 | 64.7 | 74.7 | 90.2 | 87.3 | 89.4 | 86.5 | 79.5 |
| Experiment example 49 | 1.19 | 68.6 | 78.6 | 85.0 | 87.1 | 73.3 | 52.9 | 30.0 |
| Experiment example 50 | 1.18 | 67.9 | 77.9 | 84.0 | 87.1 | 73.7 | 52.6 | 29.3 |
| Experiment example 51 | 1.17 | 66.0 | 76.0 | 82.0 | 87.1 | 74.7 | 52.4 | 27.8 |
| Experiment example 52 | 1.15 | 63.9 | 73.9 | 81.4 | 86.9 | 75.4 | 52.3 | 26.4 |
| Experiment example 53 | 1.13 | 63.0 | 73.0 | 82.9 | 86.7 | 78.4 | 57.5 | 32.0 |
| Experiment example 54 | 1.09 | 62.2 | 72.2 | 87.0 | 86.3 | 81.3 | 69.3 | 39.9 |
| Experiment example 55 | 1.10 | 65.1 | 75.1 | 89.6 | 85.8 | 83.6 | 76.2 | 49.1 |
| Experiment example 56 | 1.04 | 64.4 | 74.4 | 90.1 | 87.0 | 87.9 | 84.6 | 71.0 |
| Experiment example 57 | 1.03 | 65.1 | 75.1 | 90.1 | 87.0 | 89.2 | 86.1 | 78.8 |

TABLE 4

| | gallium content in raw material (wt. %) | film thickness (nm) | oxygen flow amount (sccm) | carrier electron density $n_e$ ($10^{20}/cm^3$) | carrier electron mobility $\mu$ ($cm^2/Vs$) | $n_e \times 10^{-20}/\mu$ | solar transmission Ts (%) | visible light transmission Tv (%) |
|---|---|---|---|---|---|---|---|---|
| Experiment example 58 | 5 | 171 | 0 | 12.06 | 19.2 | 0.63 | 74.0 | 87.3 |
| Experiment example 59 | 5 | 183 | 2.5 | 11.06 | 20.9 | 0.53 | 74.2 | 87.2 |

TABLE 4-continued

| | | | | | | | | |
|---|---|---|---|---|---|---|---|---|
| Experiment example 60 | 5 | 203 | 5 | 11.12 | 20.5 | 0.54 | 73.8 | 86.5 |
| Experiment example 61 | 5 | 219 | 7.5 | 10.64 | 24.1 | 0.44 | 73.2 | 84.3 |
| Experiment example 62 | 5 | 255 | 10 | 8.802 | 27.4 | 0.32 | 73.3 | 83.0 |
| Experiment example 63 | 5 | 260 | 12.5 | 7.397 | 29.1 | 0.25 | 74.9 | 83.1 |
| Experiment example 64 | 5 | 264 | 15 | 5.628 | 28.5 | 0.20 | 78.0 | 84.3 |
| Experiment example 65 | 5 | 250 | 17.5 | 4.055 | 25.9 | 0.16 | 80.9 | 85.0 |
| Experiment example 66 | 5 | 262 | 20 | 2.195 | 22.2 | 0.10 | 83.4 | 86.0 |
| Experiment example 67 | 6 | 135 | 0 | 7.267 | 11.2 | 0.65 | 80.2 | 85.9 |
| Experiment example 68 | 6 | 176 | 2.5 | 9.553 | 16.7 | 0.57 | 75.5 | 86.8 |
| Experiment example 69 | 6 | 188 | 5 | 9.444 | 17.6 | 0.54 | 74.6 | 85.8 |
| Experiment example 70 | 6 | 209 | 7.5 | 9.351 | 18.5 | 0.51 | 74.3 | 84.9 |
| Experiment example 71 | 6 | 239 | 10 | 9.239 | 23.6 | 0.39 | 73.5 | 82.7 |
| Experiment example 72 | 6 | 248 | 12.5 | 8.103 | 25.1 | 0.32 | 74.0 | 82.1 |
| Experiment example 73 | 6 | 265 | 15 | 5.739 | 24.9 | 0.23 | 76.7 | 83.8 |
| Experiment example 74 | 6 | 270 | 17.5 | 4.187 | 24.7 | 0.17 | 79.9 | 85.2 |
| Experiment example 75 | 6 | 274 | 20 | 2.720 | 22.9 | 0.12 | 81.9 | 86.2 |

| | Tv/Ts | 1.4Tv-54 | 1.4Tv-44 | transmission (500 nm) | transmission (750 nm) | transmission (1000 nm) | transmission (1200 nm) | transmission (1500 nm) |
|---|---|---|---|---|---|---|---|---|
| Experiment example 58 | 1.18 | 68.2 | 78.2 | 85.0 | 86.6 | 74.8 | 52.0 | 31.0 |
| Experiment example 59 | 1.18 | 68.1 | 78.1 | 84.7 | 86.7 | 75.7 | 52.9 | 31.4 |
| Experiment example 60 | 1.17 | 67.1 | 77.1 | 83.3 | 86.7 | 75.6 | 52.3 | 29.9 |
| Experiment example 61 | 1.15 | 64.0 | 74.0 | 81.5 | 86.4 | 75.9 | 52.2 | 26.5 |
| Experiment example 62 | 1.13 | 62.2 | 72.2 | 83.9 | 85.9 | 77.4 | 56.1 | 27.3 |
| Experiment example 63 | 1.11 | 62.3 | 72.3 | 87.6 | 85.2 | 79.8 | 67.8 | 38.6 |
| Experiment example 64 | 1.08 | 64.0 | 74.0 | 89.2 | 86.0 | 83.7 | 77.0 | 52.5 |
| Experiment example 65 | 1.05 | 65.0 | 75.0 | 90.1 | 86.5 | 86.8 | 82.9 | 67.3 |
| Experiment example 66 | 1.03 | 66.4 | 76.4 | 90.4 | 86.1 | 89.6 | 86.6 | 80.4 |
| Experiment example 67 | 1.07 | 66.3 | 76.3 | 87.5 | 85.8 | 82.8 | 71.3 | 58.7 |
| Experiment example 68 | 1.15 | 67.5 | 77.5 | 84.8 | 85.8 | 79.3 | 58.1 | 39.0 |
| Experiment example 69 | 1.15 | 66.1 | 76.1 | 82.6 | 85.7 | 78.5 | 55.9 | 35.2 |
| Experiment example 70 | 1.14 | 64.9 | 74.9 | 81.3 | 86.2 | 78.2 | 55.4 | 32.8 |
| Experiment example 71 | 1.13 | 61.8 | 71.8 | 82.4 | 85.7 | 77.8 | 56.8 | 29.1 |
| Experiment example 72 | 1.11 | 60.9 | 70.9 | 85.6 | 84.8 | 78.3 | 64.2 | 37.2 |
| Experiment example 73 | 1.09 | 63.3 | 73.3 | 88.7 | 85.4 | 81.7 | 73.0 | 48.0 |
| Experiment example 74 | 1.07 | 65.3 | 75.3 | 89.6 | 85.3 | 85.8 | 81.2 | 64.6 |
| Experiment example 75 | 1.05 | 66.7 | 76.7 | 89.1 | 84.6 | 88.2 | 84.7 | 75.8 |

TABLE 5

| | gallium content in raw material (wt. %) | film thickness (nm) | oxygen flow amount (sccm) | carrier electron density $n_e$ ($10^{20}/cm^3$) | carrier electron mobility $\mu$ ($cm^2/Vs$) | $n_e \times 10^{-20}/\mu$ | solar transmission Ts (%) | visible light transmission Tv (%) |
|---|---|---|---|---|---|---|---|---|
| Experiment example 76 | 7 | 173 | 0 | 6.357 | 11.1 | 0.57 | 78.9 | 88.3 |
| Experiment example 77 | 7 | 168 | 2.5 | 7.771 | 12.3 | 0.63 | 77.1 | 87.4 |
| Experiment example 78 | 7 | 176 | 5 | 8.473 | 13.2 | 0.64 | 76.3 | 86.7 |
| Experiment example 79 | 7 | 197 | 7.5 | 8.798 | 14.1 | 0.62 | 75.2 | 85.2 |
| Experiment example 80 | 7 | 226 | 10 | 8.403 | 18.4 | 0.46 | 73.7 | 82.5 |
| Experiment example 81 | 7 | 257 | 12.5 | 7.381 | 22.8 | 0.32 | 73.9 | 82.4 |
| Experiment example 82 | 7 | 272 | 15 | 5.612 | 23.2 | 0.24 | 76.1 | 83.7 |
| Experiment example 83 | 7 | 265 | 17.5 | 4.213 | 22.4 | 0.19 | 79.2 | 85.3 |
| Experiment example 84 | 7 | 283 | 20 | 2.543 | 20.3 | 0.13 | 81.8 | 86.3 |
| Experiment example 85 | 8 | 154 | 0 | 4.425 | 10.0 | 0.44 | 81.4 | 89.0 |
| Experiment example 86 | 8 | 159 | 2.5 | 5.309 | 9.62 | 0.55 | 80.4 | 89.2 |
| Experiment example 87 | 8 | 173 | 5 | 6.770 | 11.2 | 0.60 | 78.2 | 87.6 |
| Experiment example 88 | 8 | 202 | 7.5 | 7.441 | 13.9 | 0.54 | 75.7 | 84.8 |
| Experiment example 89 | 8 | 218 | 10 | 8.009 | 17.2 | 0.47 | 74.1 | 82.3 |
| Experiment example 90 | 8 | 255 | 12.5 | 6.945 | 19.0 | 0.37 | 73.6 | 82.3 |
| Experiment example 91 | 8 | 272 | 15 | 5.388 | 19.6 | 0.27 | 76.0 | 84.8 |
| Experiment example 92 | 8 | 274 | 17.5 | 3.992 | 19.1 | 0.21 | 78.7 | 86.2 |
| Experiment example 93 | 8 | 275 | 20 | 2.488 | 15.8 | 0.16 | 80.1 | 85.5 |

| | Tv/Ts | 1.4Tv-54 | 1.4Tv-44 | transmission (500 nm) | transmission (750 nm) | transmission (1000 nm) | transmission (1200 nm) | transmission (1500 nm) |
|---|---|---|---|---|---|---|---|---|
| Experiment example 76 | 1.12 | 69.6 | 79.6 | 88.4 | 85.0 | 81.8 | 68.8 | 53.8 |
| Experiment example 77 | 1.13 | 68.4 | 78.4 | 85.6 | 85.2 | 80.6 | 63.7 | 46.8 |
| Experiment example 78 | 1.14 | 67.4 | 77.4 | 84.0 | 85.3 | 80.0 | 61.8 | 43.7 |
| Experiment example 79 | 1.13 | 65.3 | 75.3 | 81.6 | 85.5 | 79.1 | 59.3 | 38.9 |
| Experiment example 80 | 1.12 | 61.5 | 71.5 | 81.0 | 85.3 | 77.6 | 57.6 | 33.5 |
| Experiment example 81 | 1.12 | 61.4 | 71.4 | 86.1 | 84.6 | 77.6 | 63.7 | 37.6 |
| Experiment example 82 | 1.10 | 63.2 | 73.2 | 88.6 | 85.1 | 80.8 | 71.2 | 46.5 |
| Experiment example 83 | 1.08 | 65.4 | 75.4 | 89.5 | 85.1 | 85.0 | 79.4 | 61.3 |
| Experiment example 84 | 1.06 | 66.8 | 76.8 | 89.5 | 84.8 | 88.3 | 84.3 | 74.0 |
| Experiment example 85 | 1.09 | 70.6 | 80.6 | 90.4 | 84.5 | 83.4 | 77.1 | 64.8 |
| Experiment example 86 | 1.11 | 70.9 | 80.9 | 88.9 | 85.0 | 82.9 | 74.4 | 60.4 |
| Experiment example 87 | 1.12 | 68.6 | 78.6 | 84.9 | 85.3 | 81.5 | 68.7 | 52.0 |
| Experiment example 88 | 1.12 | 64.7 | 74.7 | 81.0 | 85.1 | 79.3 | 62.4 | 43.0 |
| Experiment example 89 | 1.11 | 61.2 | 71.2 | 80.9 | 84.9 | 77.5 | 59.4 | 37.2 |
| Experiment example 90 | 1.12 | 61.2 | 71.2 | 86.1 | 84.2 | 76.2 | 61.7 | 38.8 |
| Experiment example 91 | 1.12 | 64.7 | 74.7 | 89.1 | 84.9 | 80.2 | 69.9 | 45.8 |

TABLE 5-continued

| | | | | | | | | |
|---|---|---|---|---|---|---|---|---|
| Experiment example 92 | 1.10 | 66.7 | 76.7 | 88.7 | 84.6 | 84.5 | 77.8 | 58.4 |
| Experiment example 93 | 1.07 | 65.7 | 75.7 | 90.3 | 85.8 | 86.3 | 80.1 | 63.9 |

TABLE 6

| | gallium content in raw material (wt. %) | film thickness (nm) | oxygen flow amount (sccm) | carrier electron density $n_e$ ($10^{20}/cm^3$) | carrier electron mobility $\mu$ ($cm^2/Vs$) | $n_e \times 10^{-20}/\mu$ | solar transmission Ts (%) | visible light transmission Tv (%) |
|---|---|---|---|---|---|---|---|---|
| Experiment example 94 | 9 | 139 | 0 | 3.991 | 8.88 | 0.45 | 82.4 | 89.2 |
| Experiment example 95 | 9 | 158 | 2.5 | 3.771 | 9.19 | 0.41 | 81.8 | 89.9 |
| Experiment example 96 | 9 | 153 | 5 | 4.695 | 9.14 | 0.51 | 81.1 | 89.5 |
| Experiment example 97 | 9 | 173 | 7.5 | 5.883 | 8.66 | 0.68 | 80.2 | 88.4 |
| Experiment example 98 | 9 | 209 | 10 | 6.259 | 10.9 | 0.57 | 77.4 | 83.8 |
| Experiment example 99 | 9 | 242 | 12.5 | 6.214 | 14.9 | 0.42 | 74.8 | 81.9 |
| Experiment example 100 | 9 | 270 | 15 | 5.095 | 16.4 | 0.31 | 75.7 | 83.3 |
| Experiment example 101 | 9 | 276 | 17.5 | 3.611 | 17.5 | 0.21 | 77.3 | 85.2 |
| Experiment example 102 | 9 | 288 | 20 | 2.762 | 16.1 | 0.17 | 79.4 | 86.7 |
| Experiment example 103 | 11 | 147 | 0 | 3.076 | 8.90 | 0.35 | 82.8 | 89.2 |
| Experiment example 104 | 11 | 152 | 2.5 | 2.771 | 9.17 | 0.30 | 82.8 | 89.3 |
| Experiment example 105 | 11 | 146 | 5 | 2.908 | 9.09 | 0.32 | 82.7 | 89.8 |
| Experiment example 106 | 11 | 160 | 7.5 | 3.220 | 8.62 | 0.37 | 82.3 | 90.0 |
| Experiment example 107 | 11 | 193 | 10 | 3.318 | 8.70 | 0.38 | 81.3 | 87.4 |
| Experiment example 108 | 11 | 216 | 12.5 | 3.371 | 8.84 | 0.38 | 80.4 | 82.4 |
| Experiment example 109 | 11 | 228 | 15 | 3.641 | 10.8 | 0.34 | 79.0 | 80.4 |
| Experiment example 110 | 11 | 252 | 17.5 | 3.113 | 9.92 | 0.31 | 79.4 | 81.9 |
| Experiment example 111 | 11 | 256 | 20 | 2.174 | 8.66 | 0.25 | 80.4 | 82.9 |
| Experiment example 112 | 10 | 546 | 5 | 4.9 | 11 | 0.45 | 66.2 | 82.9 |
| Experiment example 113 | 8 | 630 | 5 | 6.2 | 18.5 | 0.34 | 61.9 | 82.7 |
| Experiment example 114 | 8 | 527 | 0 | 6.1 | 17 | 0.36 | 61.9 | 82.3 |
| Experiment example 115 | 8 | 647 | 10 | 5.8 | 20.1 | 0.29 | 64.0 | 83.2 |
| Experiment example 116 | 3 | 705 | 10 | 6.9 | 33.2 | 0.21 | 68.6 | 83.5 |

| | Tv/Ts | 1.4Tv-54 | 1.4Tv-44 | transmission (500 nm) | transmission (750 nm) | transmission (1000 nm) | transmission (1200 nm) | transmission (1500 nm) |
|---|---|---|---|---|---|---|---|---|
| Experiment example 94 | 1.08 | 70.9 | 80.9 | 90.8 | 84.0 | 83.5 | 80.1 | 70.4 |
| Experiment example 95 | 1.10 | 71.9 | 81.9 | 89.7 | 84.9 | 83.2 | 78.8 | 67.3 |
| Experiment example 96 | 1.10 | 71.3 | 81.3 | 87.4 | 85.7 | 82.9 | 76.9 | 63.4 |
| Experiment example 97 | 1.10 | 69.8 | 79.8 | 85.1 | 86.2 | 82.5 | 74.7 | 59.7 |
| Experiment example 98 | 1.08 | 63.3 | 73.3 | 79.6 | 86.7 | 80.6 | 68.5 | 49.7 |
| Experiment example 99 | 1.09 | 60.7 | 70.7 | 84.8 | 85.2 | 77.5 | 64.3 | 43.0 |

TABLE 6-continued

| | | | | | | | |
|---|---|---|---|---|---|---|---|
| Experiment example 100 | 1.10 | 62.6 | 72.6 | 88.1 | 85.6 | 79.2 | 67.3 | 44.8 |
| Experiment example 101 | 1.10 | 65.3 | 75.3 | 89.6 | 85.1 | 82.2 | 73.1 | 51.2 |
| Experiment example 102 | 1.09 | 67.4 | 77.4 | 88.8 | 84.4 | 85.5 | 79.1 | 61.9 |
| Experiment example 103 | 1.08 | 70.9 | 80.9 | 90.7 | 83.6 | 83.3 | 81.4 | 73.6 |
| Experiment example 104 | 1.08 | 71.0 | 81.0 | 90.8 | 83.7 | 83.3 | 81.5 | 73.8 |
| Experiment example 105 | 1.09 | 71.7 | 81.7 | 90.5 | 84.1 | 83.1 | 81.2 | 73.4 |
| Experiment example 106 | 1.09 | 72.0 | 82.0 | 88.4 | 85.4 | 83.0 | 80.0 | 70.5 |
| Experiment example 107 | 1.08 | 68.4 | 78.4 | 82.4 | 87.6 | 82.9 | 78.3 | 66.2 |
| Experiment example 108 | 1.02 | 61.4 | 71.4 | 78.0 | 89.2 | 82.9 | 77.3 | 63.9 |
| Experiment example 109 | 1.02 | 58.6 | 68.6 | 82.0 | 88.4 | 82.7 | 75.3 | 59.5 |
| Experiment example 110 | 1.03 | 60.7 | 70.7 | 87.3 | 87.3 | 84.4 | 77.3 | 61.4 |
| Experiment example 111 | 1.03 | 62.1 | 72.1 | 89.3 | 86.7 | 86.3 | 80.2 | 67.3 |
| Experiment example 112 | 1.25 | 62.1 | 72.1 | 87.1 | 79.2 | 65.1 | 40.1 | 15.9 |
| Experiment example 113 | 1.34 | 61.8 | 71.8 | 77.4 | 78.0 | 59.5 | 25.1 | 4.4 |
| Experiment example 114 | 1.33 | 61.2 | 71.2 | 84.6 | 75.8 | 58.9 | 23.2 | 7.2 |
| Experiment example 115 | 1.30 | 62.5 | 72.5 | 84.6 | 81.2 | 63.8 | 31.8 | 5.4 |
| Experiment example 116 | 1.22 | 62.9 | 72.9 | 82.1 | 82.9 | 71.9 | 54.5 | 7.9 |

As being understood from FIG. 4, as the carrier electron density is higher, the thin films are shown in the more right and lower parts. That is, it is made clear that the thin films have a high visible light transmission and a low solar transmission. From these results, it is made clear that as the carrier electron density is higher, a gallium containing zinc oxide thin film more excellent in the transparency and the heat ray shielding function can be obtained.

Further, from FIGS. 9 and 10, it is made clear that the IR reflection performance is high in the case the gallium content is in the range of 3 to 8% by weight.

INDUSTRIAL APPLICABILITY

The present invention provides a gallium containing zinc oxide with an improved heat ray shielding function while keeping high transparency to visible light rays.

Figure 1:
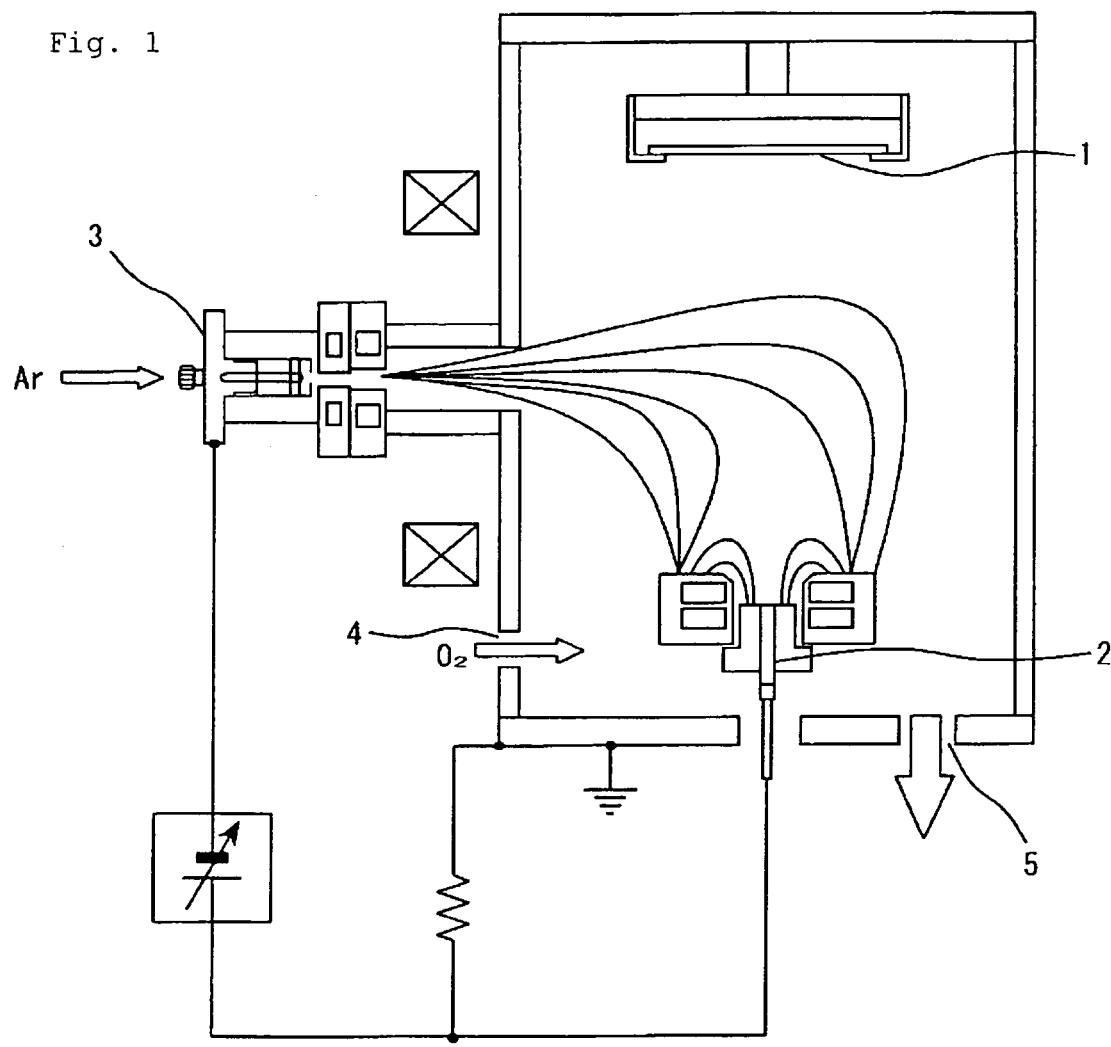
FIG. 1 is a schematic drawing showing one embodiment of an ion plating apparatus capable of producing a gallium containing zinc oxide thin film of the present invention.
Figure 2:
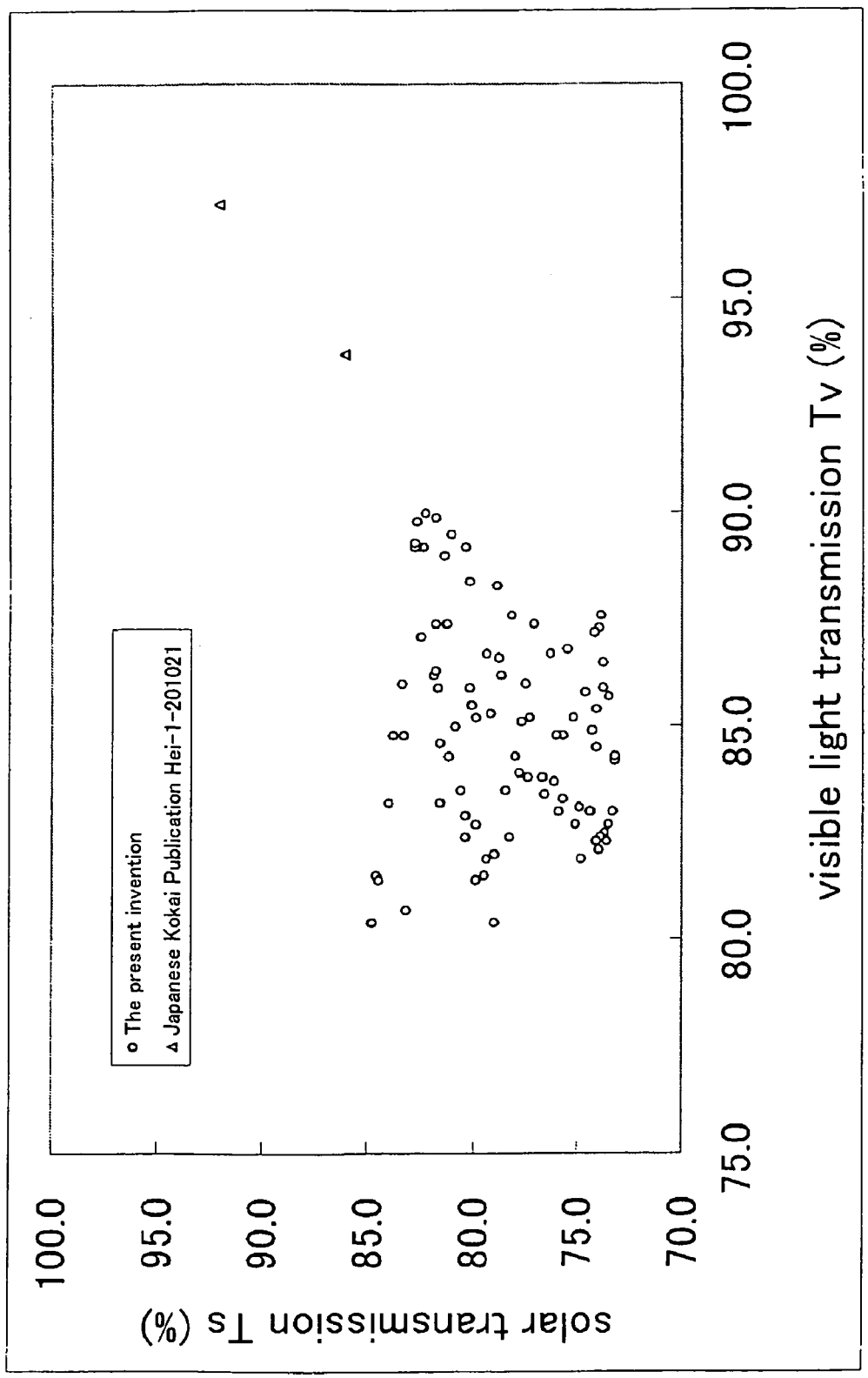
FIG. 2 is a drawing showing the correlation of the visible light transmission and the solar transmission of gallium containing zinc oxide thin films of the present invention and conventional aluminum containing zinc oxide thin films in the case a film thickness is in the range about 100 to 300 nm.
Figure 3:
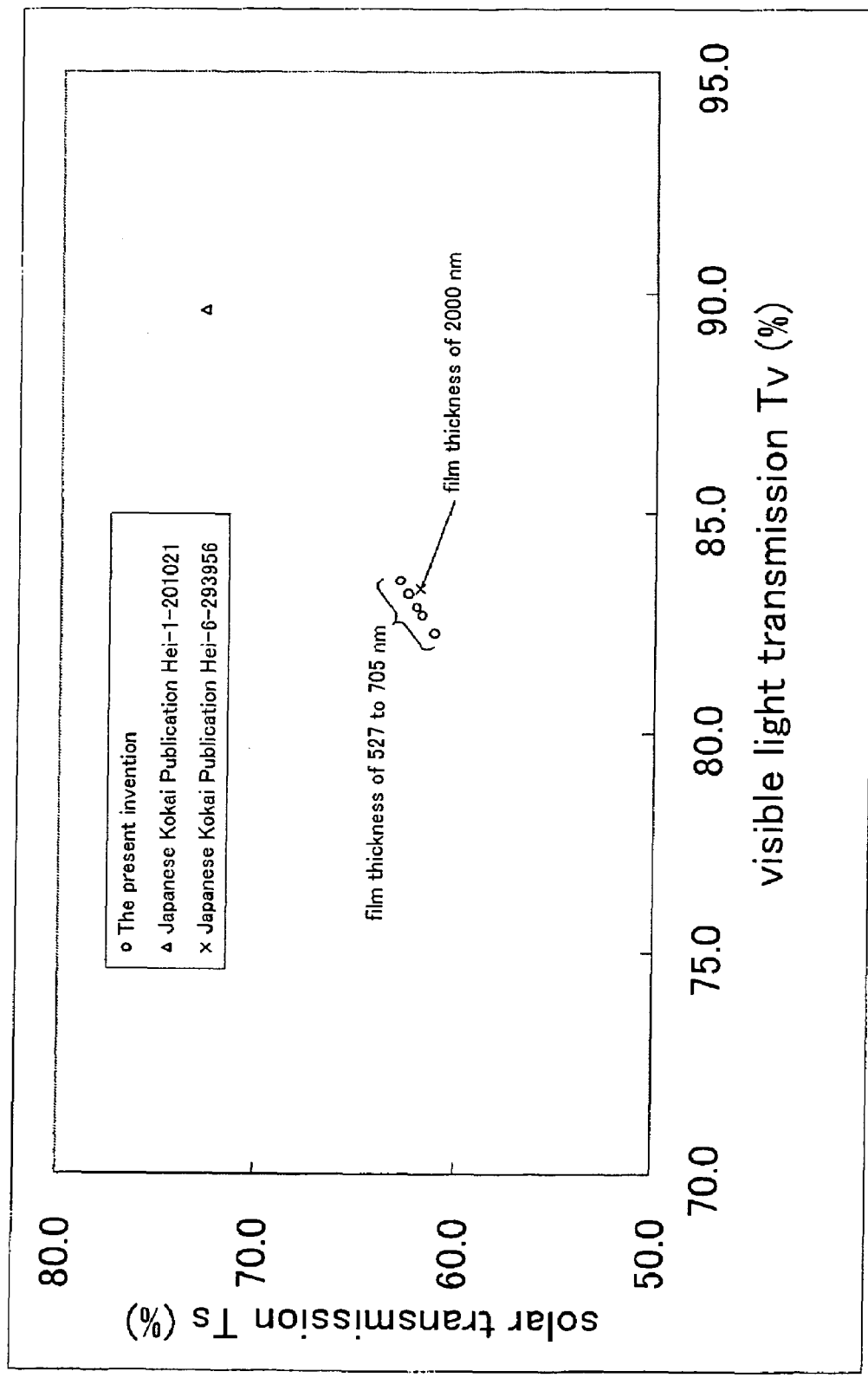
FIG. 3 is a drawing showing the correlation of the visible light transmission and the solar transmission of gallium containing zinc oxide thin films of the present invention and conventional aluminum containing zinc oxide thin films in the case a film thickness is 500 nm or thicker.
Figure 4:
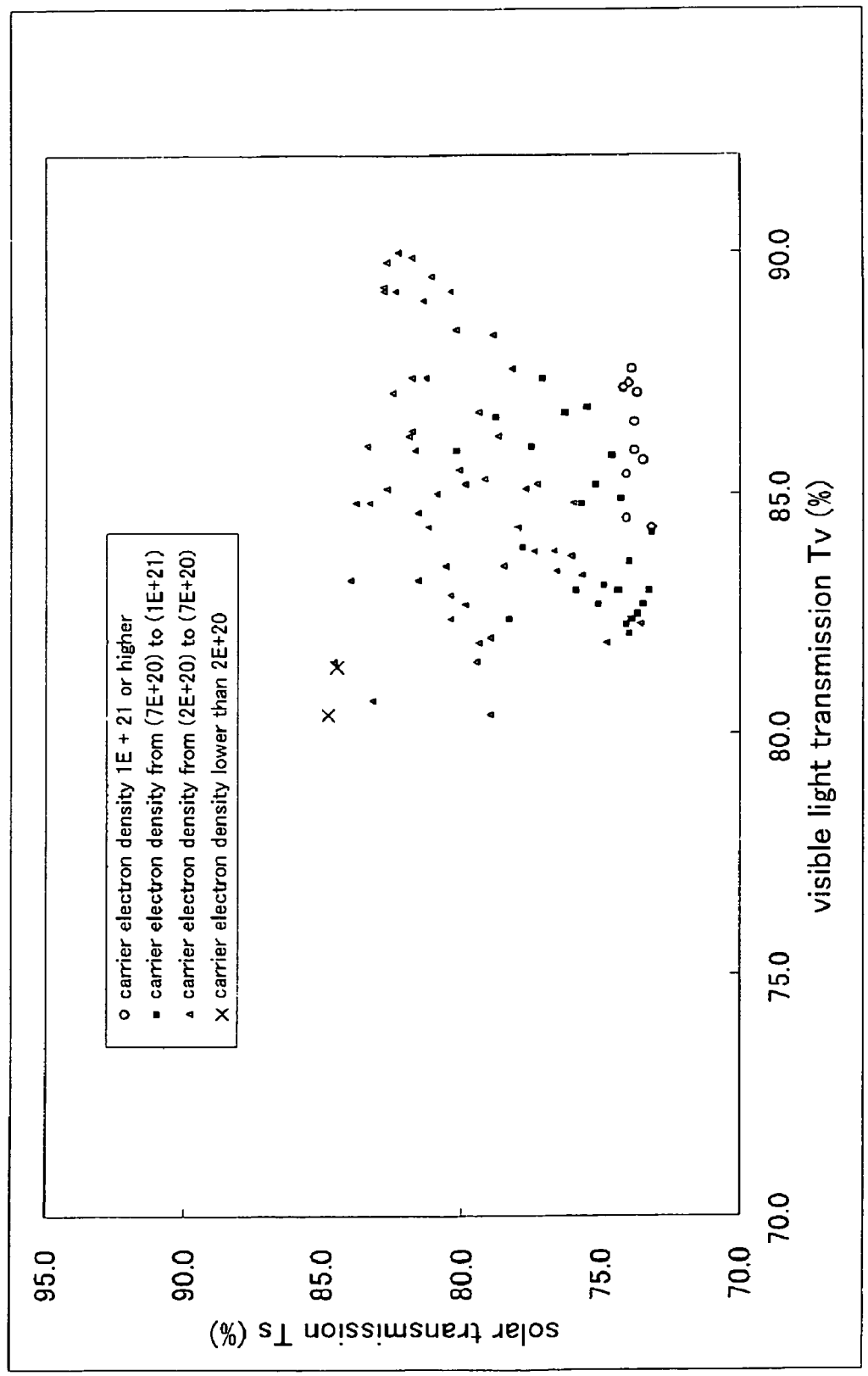
FIG. 4 is a drawing showing the correlation of the visible light transmission Tv and the solar transmission Ts of gallium containing zinc oxide thin films obtained in Experiment examples 22 to 111.
Figure 5:
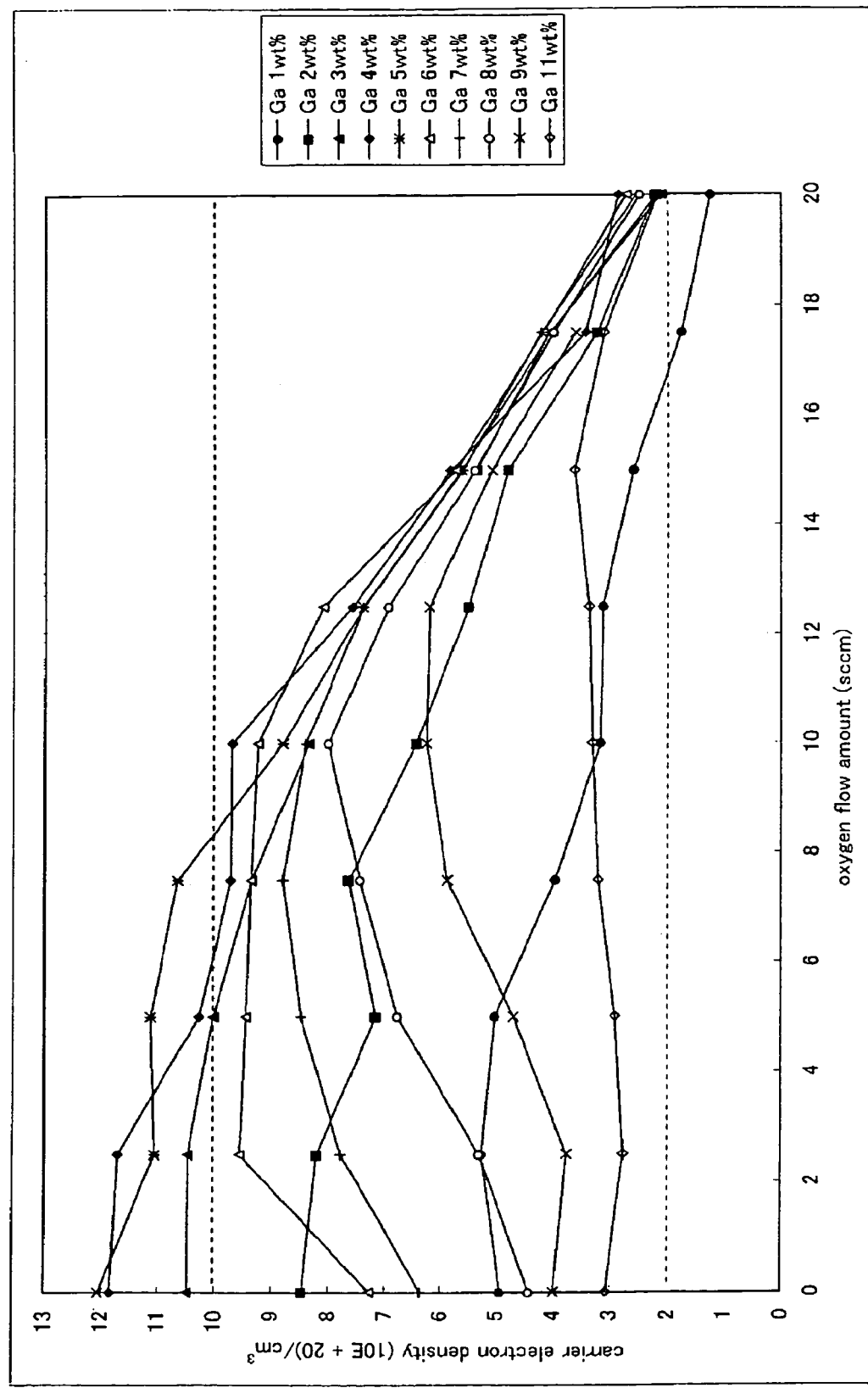
FIG. 5 is a drawing showing the correlation of the oxygen flow amount and carrier electron density of gallium containing zinc oxide thin films obtained in Experiment examples 22 to 111.
Figure 6:
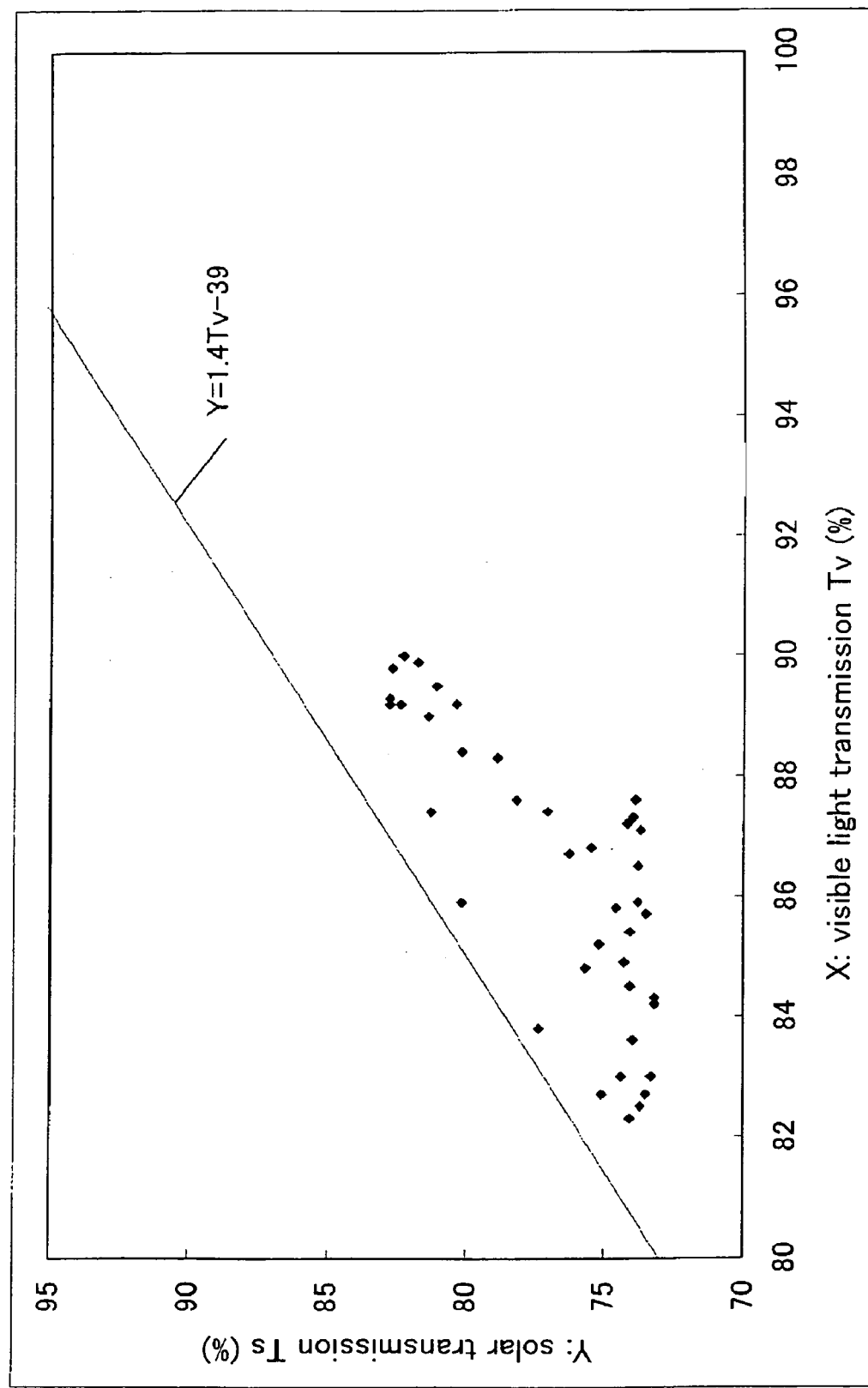
FIG. 6 is a drawing showing the correlation of the visible light transmission Tv and the solar transmission Ts of gallium containing zinc oxide thin films having the gallium content in the range of 3 to 11% by weight and the oxygen flow amount in the range of 0 to 10 sccm among the gallium containing zinc oxide thin film obtained in Experiment examples 22 to 111.
Figure 7:
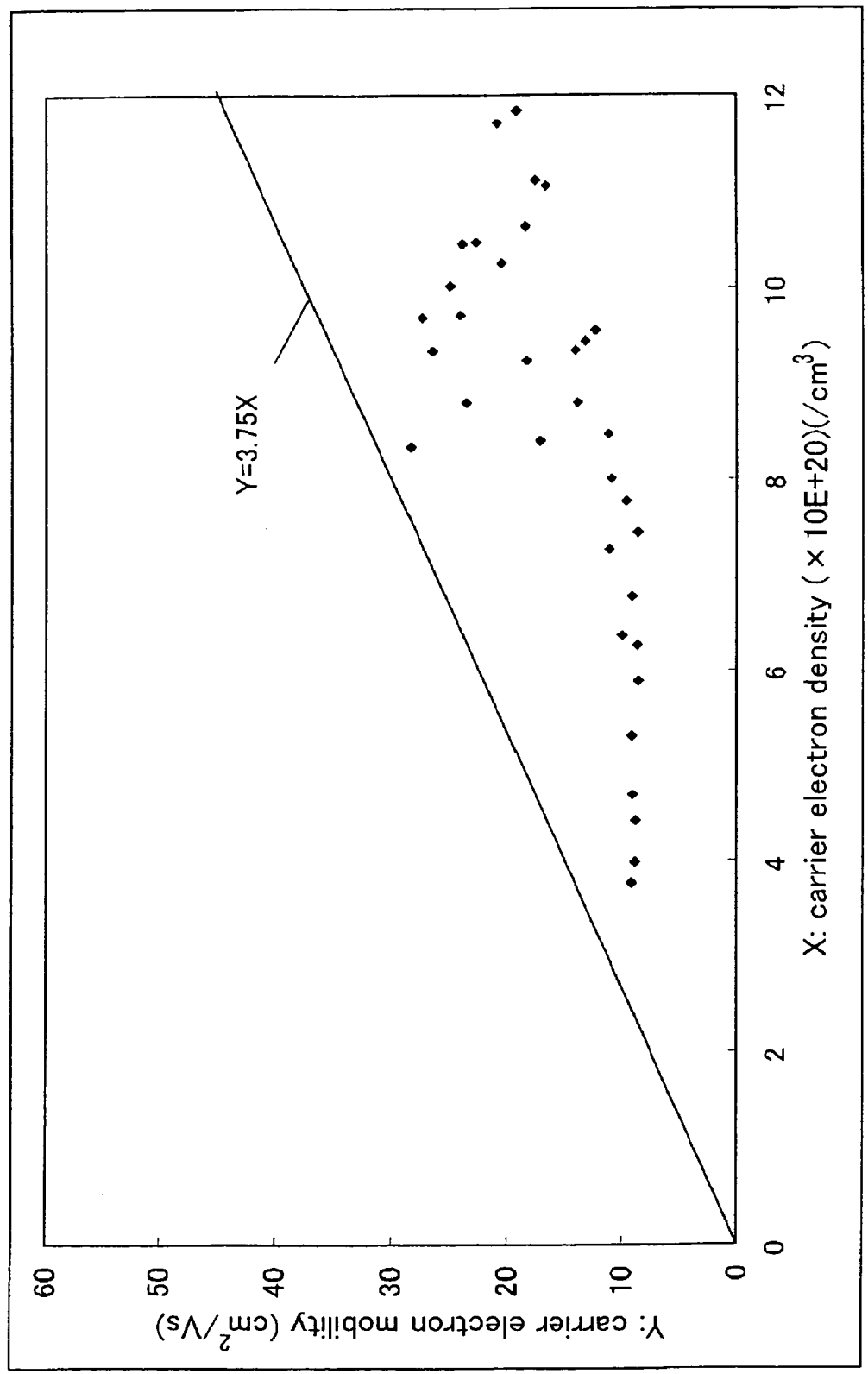
FIG. 7 is a drawing showing the correlation of the carrier electron density $n_e$ and the carrier electron mobility $\mu$ of gallium containing zinc oxide thin films having the gallium content in the range of 3 to 11% by weight and the oxygen flow amount in the range of 0 to 10 sccm among the gallium containing zinc oxide thin film obtained in Experiment examples 22 to 111.
Figure 8:
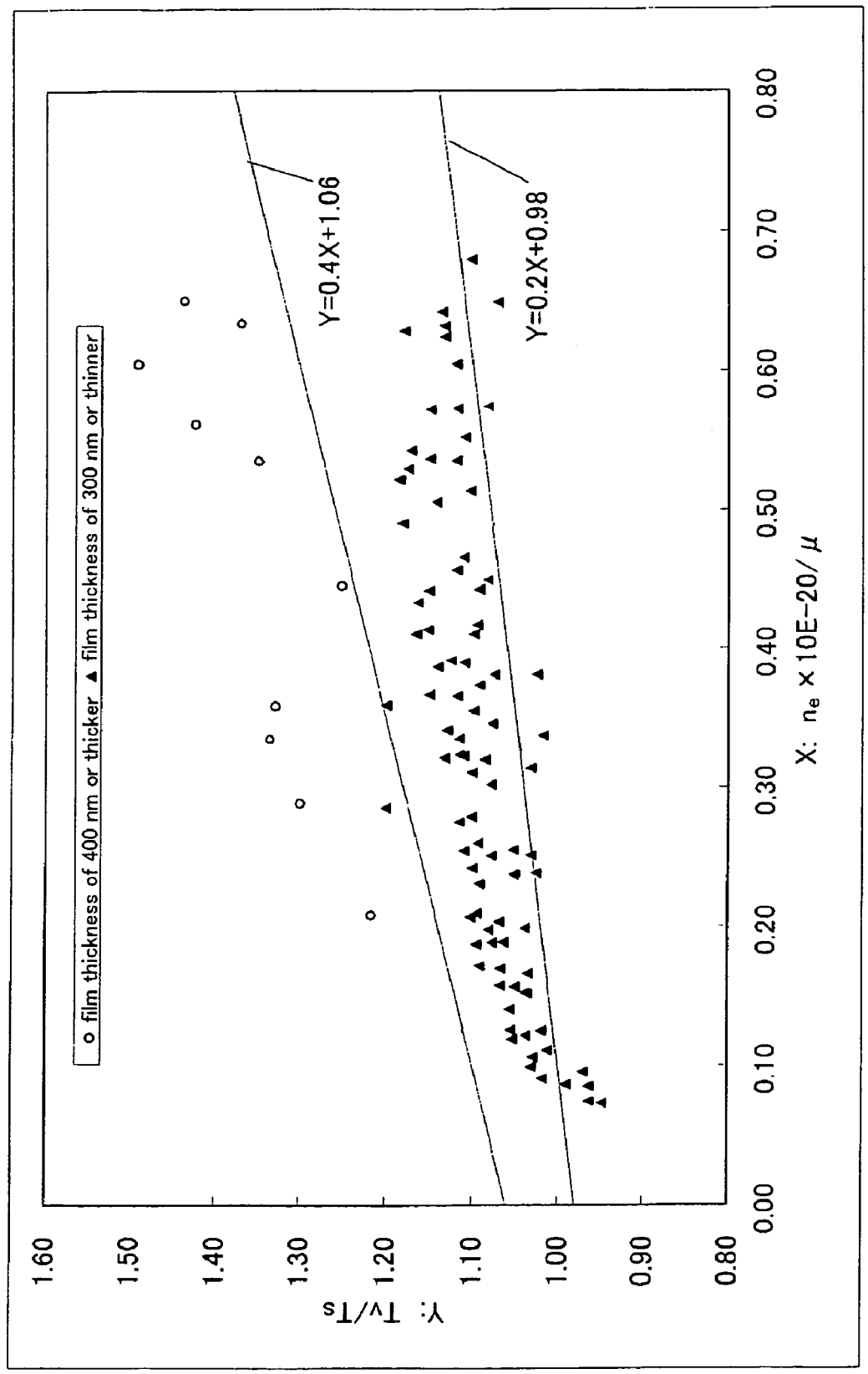
FIG. 8 is a drawing showing the relation of (carrier electron density×$10^{-20}$/carrier electron mobility) with Tv/Ts for the gallium containing zinc oxide thin films of Experiment examples 1 to 116.
Figure 9:
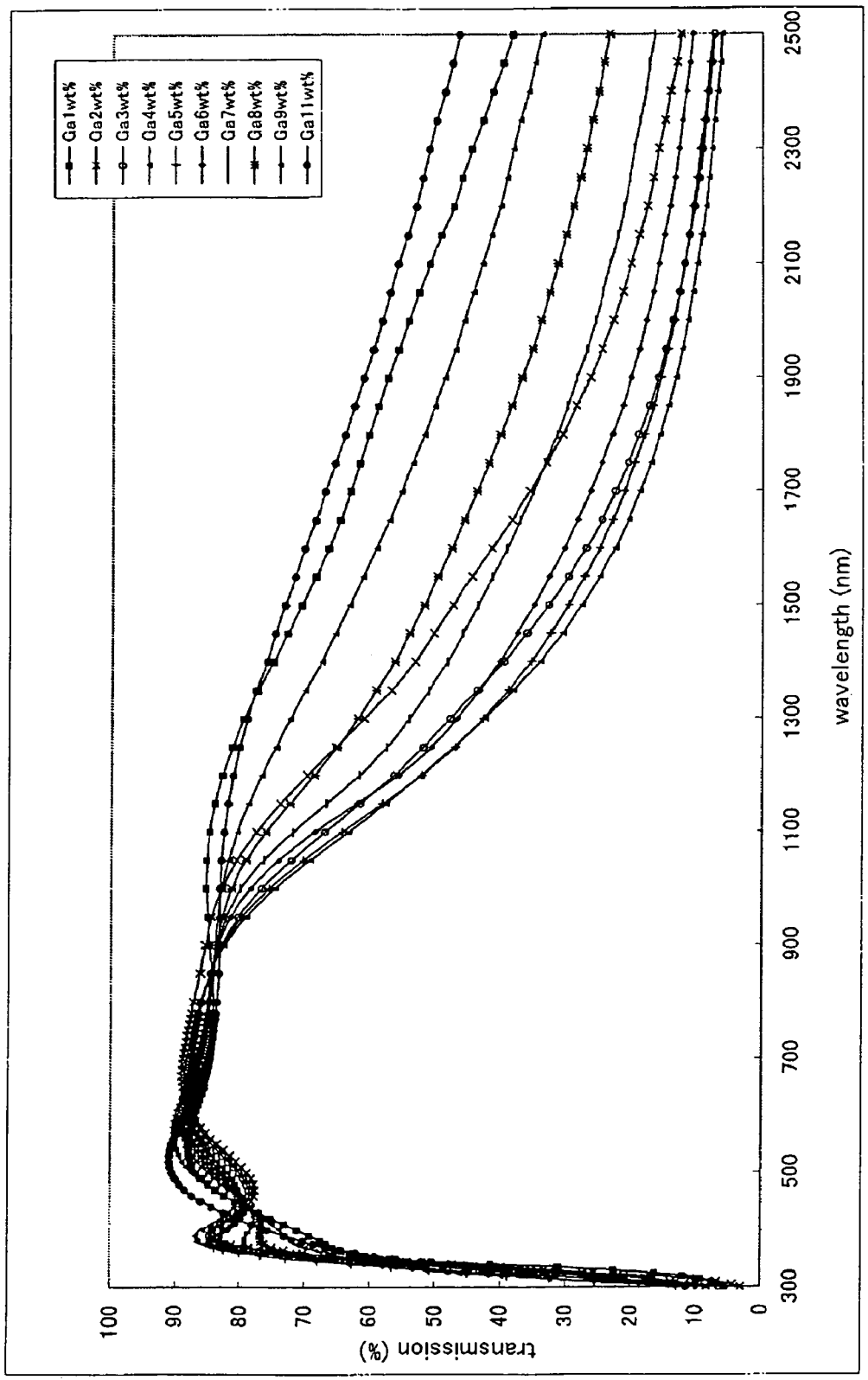
FIG. 9 is a drawing showing the correlation of the wavelength in the range of 300 to 2500 nm and transmission of the gallium containing zinc oxide thin films of Experiment examples 22 to 111 obtained under condition of oxygen flow amount of 5 sccm.
Figure 10:
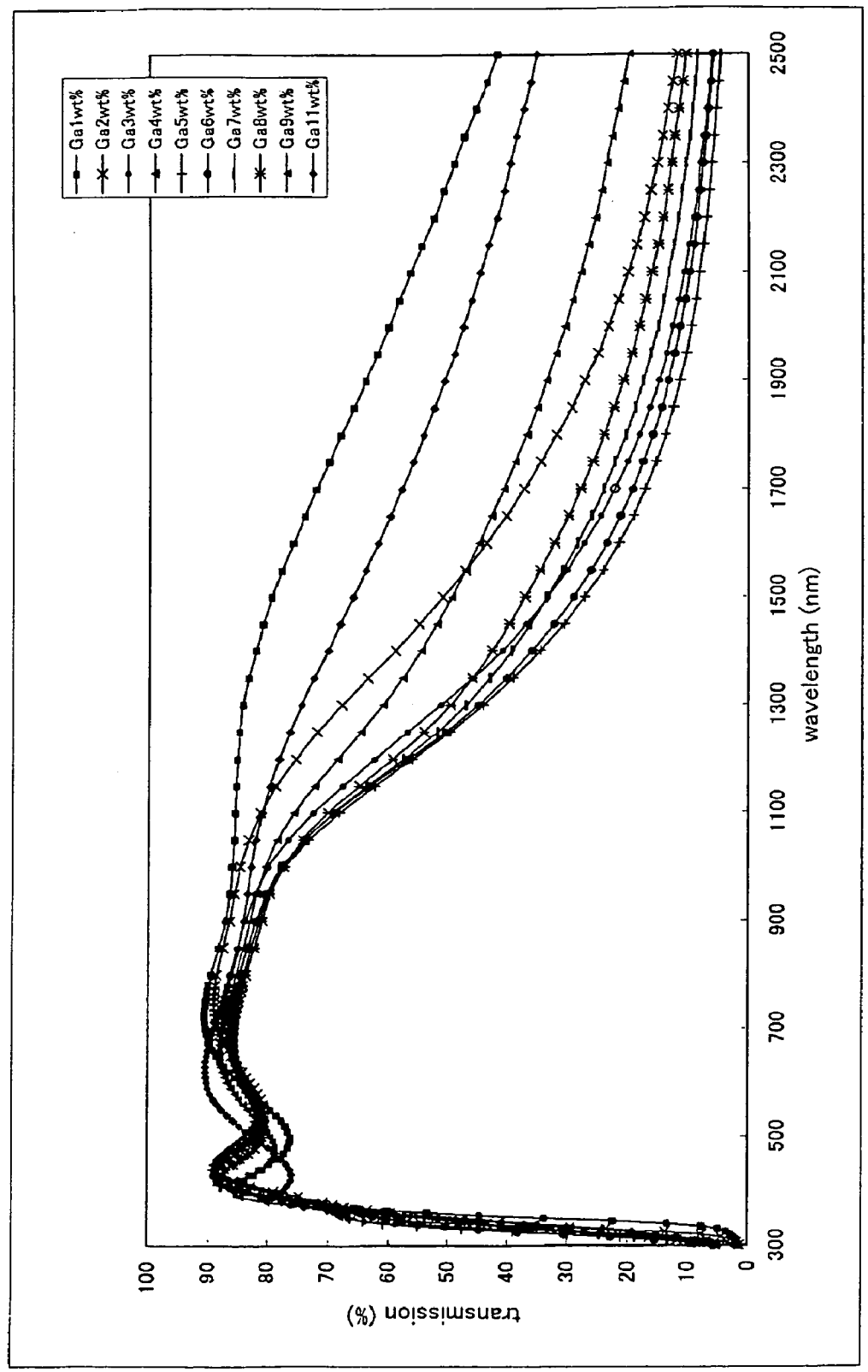
FIG. 10 is a drawing showing the correlation of the wavelength in the range of 300 to 2500 nm and transmission of the gallium containing zinc oxide thin films of Experiment examples 22 to 111 obtained under condition of oxygen flow amount of 10 sccm.

| Explanation of Symbols |
| --- |
| 1 Substrate |
| 2 Hearth |
| 3 Plasma beam generator |
| 4 Ventilation hole |
| 5 Evacuation hole |

The invention claimed is:

1. A gallium containing zinc oxide, which has a heat ray shielding function, a gallium content in the range of 0.25 to 25% by weight, and a carrier electron density $n_e$ of $2\times10^{20}/$cm$^3$ or higher, and which further contains an element having a covalent bond radius different from that of zinc atom in the same content or lower than the content of the gallium.

2. The gallium containing zinc oxide according to claim 1, wherein a carrier electron mobility μ is in the range of 0.1 to 40 cm$^2$/Vs.

3. The gallium containing zinc oxide according to claim 1, wherein the carrier electron density $n_e$ and the carrier electron mobility μ satisfy $\mu \leq 3.75\, n_e \times 10^{-20}$.

4. The gallium containing zinc oxide according to claim 1, wherein the carrier electron density $n_e$ and the carrier electron mobility μ satisfy $0.2 \leq (n_e \times 10^{-20}/\mu)$ and a solar transmission Ts and a visible light transmission Tv satisfy Tv/Ts≧1.0.

5. The gallium containing zinc oxide according to claim 1, wherein the element having a covalent bond radius different from that of zinc atom is an element having a tetra-coordination ion radius in the range of 0.4 to 0.95 nm except gallium.

6. The gallium containing zinc oxide according to claim 1, wherein the element having a covalent bond radius different from that of zinc atom is an element of Group XIII elements or Group XIV elements except gallium.

7. The gallium containing zinc oxide according to claim 1, wherein the element having a covalent bond radius different from that of zinc atom is fluorine element or chlorine element.

8. A gallium containing zinc oxide thin film, which comprises the gallium containing zinc oxide according to claim 1, and has a film thickness of 5 μm or thinner, the solar transmission Ts and the visible light transmission Tv satisfying Ts≦1.4 Tv−39.

9. The gallium containing zinc oxide thin film according to claim 8, which has a film thickness of 5000 nm or thinner, and the visible light transmission Tv of 70% or higher and/or the transmission of 70% or higher for light rays with wavelength of 500 nm.

10. The gallium containing zinc oxide thin film according to claim 8, wherein the solar transmission Ts and the visible light transmission Tv satisfy Ts≦1.4 Tv−44 in the case the film thickness is in the range of 30 to 350 nm.

11. The gallium containing zinc oxide thin film according to claim 8, wherein the solar transmission Ts and the visible light transmission Tv satisfy Ts≦1.4 Tv−54 in the case the film thickness is in the range of 350 to 5000 mm.

12. The gallium containing zinc oxide thin film according to claim 8, wherein the transmission for light rays with wavelength of 750 mm is 88% or lower.

13. The gallium containing zinc oxide thin film according to claim 12, wherein the transmission for light rays with wavelength of 750 nm is 75% or lower.

14. The gallium containing zinc oxide thin film according to claim 8, wherein the transmission for light rays with wavelength of 1000 mm is 80% or lower.

15. The gallium containing zinc oxide thin film according to claim 14, wherein the transmission for light rays with wavelength of 1000 nm is 60% or lower.

16. The gallium containing zinc oxide thin film according to claim 8, wherein the transmission for light rays with wavelength of 1200 mm is 65% or lower.

17. The gallium containing zinc oxide thin film according to claim 16, wherein the transmission for light rays with wavelength of 1200 mm is 35% or lower.

18. The gallium containing zinc oxide thin film according to claim 8, wherein the transmission for light rays with wavelength of 1500 nm is 40% or lower.

19. The gallium containing zinc oxide thin film according to claim 18, wherein the transmission for light rays with wavelength of 1500 mm is 15% or lower.

* * * * *

UNITED STATES PATENT AND TRADEMARK OFFICE
CERTIFICATE OF CORRECTION

| | |
|---|---|
| PATENT NO. | : 7,651,640 B2 |
| APPLICATION NO. | : 10/580030 |
| DATED | : January 26, 2010 |
| INVENTOR(S) | : Juichi Fukatani et al. |

It is certified that error appears in the above-identified patent and that said Letters Patent is hereby corrected as shown below:

On the cover page under item (86), the last line should read "(2), (4) Date: August 31, 2006" in lieu of -- (2), (4) Date: August 31, 2007 --

Signed and Sealed this

Twenty-seventh Day of April, 2010

David J. Kappos
*Director of the United States Patent and Trademark Office*